(12) United States Patent
Yamada et al.

(10) Patent No.: US 10,573,491 B2
(45) Date of Patent: Feb. 25, 2020

(54) DEVICE, MANUFACTURING METHOD, AND EXPOSURE APPARATUS

(71) Applicant: ADVANTEST CORPORATION, Tokyo (JP)

(72) Inventors: Akio Yamada, Gunma (JP); Shinji Sugatani, Gunma (JP); Masaki Kurokawa, Gunma (JP); Masahiro Takizawa, Gunma (JP); Ryuma Iwashita, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 872 days.

(21) Appl. No.: 15/099,619

(22) Filed: Apr. 15, 2016

(65) Prior Publication Data

US 2016/0314930 A1 Oct. 27, 2016

(30) Foreign Application Priority Data

Apr. 27, 2015 (JP) ................................ 2015-090453

(51) Int. Cl.
*H01J 37/147* (2006.01)
*H01J 37/317* (2006.01)
*H01J 37/04* (2006.01)

(52) U.S. Cl.
CPC ........ *H01J 37/3174* (2013.01); *H01J 37/045* (2013.01); *H01J 37/3177* (2013.01);
(Continued)

(58) Field of Classification Search
CPC .... H01J 37/045; H01J 37/304; H01J 37/1474; H01J 37/3174; H01J 37/3177;
(Continued)

(56) References Cited

U.S. PATENT DOCUMENTS

| 4,982,099 A | 1/1991 | Lischke |
| 5,814,423 A | 9/1998 | Maruyama et al. |

(Continued)

FOREIGN PATENT DOCUMENTS

| EP | 1635374 A1 | 3/2006 |
| JP | H5-109608 A | 4/1993 |

(Continued)

OTHER PUBLICATIONS

Notice of First Office Action for Patent Application No. 201610235948. 4, issued by the State Intellectual Property Office of the People's Republic of China dated Jul. 25, 2017.
(Continued)

*Primary Examiner* — David E Smith
*Assistant Examiner* — Hsien C Tsai

(57) ABSTRACT

To realize a multi-beam formation device that can stably machine a fine pattern using complementary lithography, provided is a device that deforms and deflects a beam, including an aperture layer having a first aperture that deforms and passes a beam incident thereto from a first surface side of the device and a deflection layer that passes and deflects the beam that has been passed by the aperture layer. The deflection layer includes a first electrode section having a first electrode facing a beam passing space in the deflection layer corresponding to the first aperture and a second electrode section having an extending portion that extends toward the beam passing space and is independent from an adjacent layer in the deflection layer and a second electrode facing the first electrode in a manner to sandwich the beam passing space between the first electrode and an end portion of the second electrode.

18 Claims, 26 Drawing Sheets

(52) U.S. Cl.
CPC ........... *H01J 2237/0213* (2013.01); *H01J 2237/0437* (2013.01); *H01J 2237/1501* (2013.01); *H01J 2237/20228* (2013.01); *H01J 2237/31766* (2013.01)

(58) Field of Classification Search
CPC .......... H01J 2237/063; H01J 2237/213; H01J 2237/0437; H01J 2237/1501; H01J 2237/20228; H01J 2237/30483; H01J 2237/31766
See application file for complete search history.

(56) References Cited

U.S. PATENT DOCUMENTS

| | | | |
|---|---|---|---|
| 2003/0218140 A1* | 11/2003 | Tamamori | B82Y 10/00 250/492.1 |
| 2010/0288938 A1 | 11/2010 | Platzgummer | |
| 2013/0011796 A1 | 1/2013 | Hirata | |
| 2013/0112891 A1* | 5/2013 | Kato | H01J 37/045 250/396 R |
| 2013/0196517 A1 | 8/2013 | Tsujita et al. | |
| 2014/0077078 A1 | 3/2014 | Hatakeyama et al. | |
| 2015/0090896 A1 | 4/2015 | Tsuchiya et al. | |
| 2016/0189930 A1 | 6/2016 | Yamada et al. | |

FOREIGN PATENT DOCUMENTS

| | | |
|---|---|---|
| JP | H05166707 A | 7/1993 |
| JP | H10-64780 A | 3/1998 |
| JP | 2003303760 A | 10/2003 |
| JP | 2014003279 A | 1/2014 |
| WO | 2009/127658 A1 | 10/2009 |

OTHER PUBLICATIONS

Office Action issued for counterpart Korean Application 10-2016-0047023, issued by the Korean Intellectual Property Office dated Jun. 16, 2017.

Partial European Search Report for European Patent Application No. 16166085.7, issued by the European Patent Office dated Oct. 12, 2016.

Office Action issued for counterpart Taiwanese Application 105111649, issued by the Taiwan Intellectual Property Office dated Nov. 8, 2017.

Extended European Search Report for European Patent Application No. 16 16 6085.7, issued by the European Patent Office dated Jan. 16, 2017.

Office Action issued for counterpart Japanese Application No. 2015-090453, drafted by the Japan Patent Office dated Mar. 8, 2019.

* cited by examiner

A-A' CROSS SECTION

DEVICE, MANUFACTURING METHOD, AND EXPOSURE APPARATUS

The contents of the following Japanese patent application are incorporated herein by reference:
NO. 2015-090453 filed on Apr. 27, 2015.

BACKGROUND

1. Technical Field

The present invention relates to a device, an exposure apparatus, and a manufacturing method.

2. Related Art

Conventionally, complementary lithography is known for forming a fine wire pattern by performing machining of a simple line pattern formed by optical exposure technology with a line width of tens of nanometers, using a charged particle beam such as an electron beam, as shown in Patent Documents 1 and 2, for example. Furthermore, a multi-beam exposure technique is known using a device that forms a multi-beam including a plurality of charged particle beams, as shown in Patent Documents 3 and 4, for example.

Patent Document 1: Japanese Patent Application Publication No. 2013-16744
Patent Document 2: Japanese Patent Application Publication No. 2013-157547
Patent Document 3: Japanese Patent Application Publication No. 2010-267962
Patent Document 4: Japanese Patent Application Publication No. H9-293654

However, with such techniques, when using multi-beam exposure employing a conventional multi-beam forming device, it is difficult to machine line patterns formed with different line widths and different pitches. On the other hand, the line patterns that are to be machined have become finer, and a multi-beam forming device is desired that is capable of stably machining a fine line pattern.

SUMMARY

Therefore, it is an object of an aspect of the innovations herein to provide a device, a manufacturing method, and an exposure apparatus, which are capable of overcoming the above drawbacks accompanying the related art. The above and other objects can be achieved by combinations described in the claims. According to a first aspect of the present invention, provided is a device that deforms and deflects a beam, comprising an aperture layer that includes a first aperture that deforms and passes a beam incident thereto from a first surface side of the device and a deflection layer that passes and deflects the beam that has been passed by the aperture layer. The deflection layer includes a first electrode section that includes a first electrode facing a beam passing space in the deflection layer corresponding to the first aperture and a second electrode section that includes an extending portion that extends toward the beam passing space and is independent from an adjacent layer in the deflection layer and a second electrode that faces the first electrode in a manner to sandwich the beam passing space between the first electrode and an end portion of the second electrode.

According to a second aspect of the present invention, provided is a manufacturing method for manufacturing a device that deforms and deflects a beam, comprising forming an aperture layer that includes a first aperture that deforms and passes a beam incident thereto from a first surface side of the device and forming a deflection layer that passes and deflects the beam that has been passed by the aperture layer. Forming the deflection layer includes forming a first electrode section that includes a first electrode facing a beam passing space in the deflection layer corresponding to the first aperture and forming a second electrode section that includes an extending portion that extends toward the beam passing space and is independent from an adjacent layer in the deflection layer and a second electrode that faces the first electrode and in a manner to sandwich the beam passing space between the first electrode and an end portion of the second electrode.

The summary clause does not necessarily describe all necessary features of the embodiments of the present invention. The present invention may also be a sub-combination of the features described above.

BRIEF DESCRIPTION OF THE DRAWINGS

FIG. 13 shows an exemplary perspective view of a portion of the deflection layer 60 according to the present embodiment, as seen from the beam passing space 62a.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
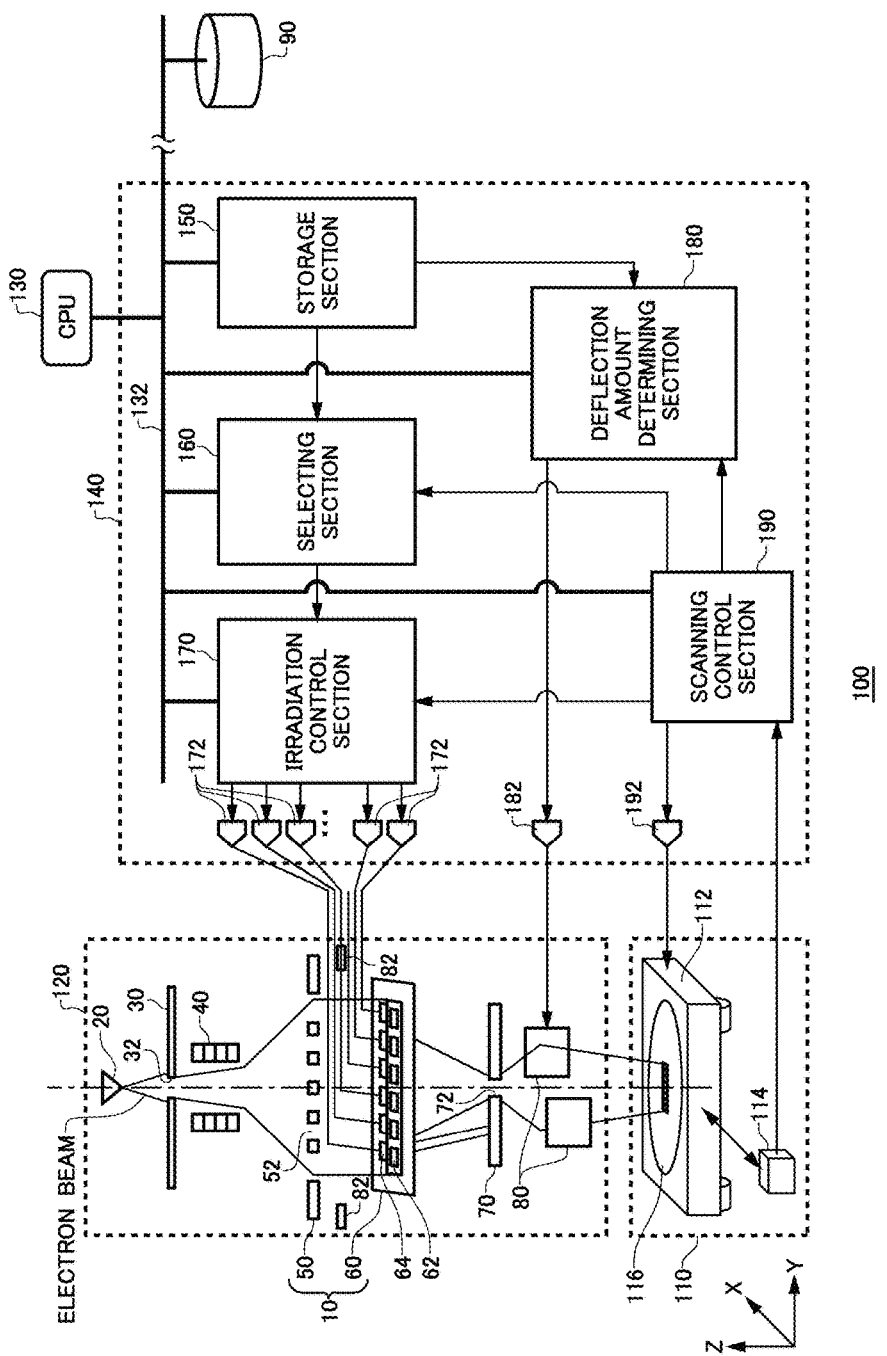
FIG. 1 shows an exemplary configuration of an exposure apparatus 100 according to an embodiment of the present invention.

FIG. 1 shows an exemplary configuration of an exposure apparatus 100 according to an embodiment of the present invention. The exposure apparatus 100 radiates a charged particle beam having an irradiation region corresponding to a predetermined grid at a position corresponding to a line pattern on a sample formed with different line widths and different pitches based on the grid, thereby exposing the line pattern. The exposure apparatus 100 includes a stage section 110, a column section 120, a CPU 130, and an exposure control section 140.

The stage section 110 has the sample 116 mounted thereon and moves the sample 116. The sample 116 may be a substrate formed of a semiconductor, glass, and/or ceramic, for example, and may be a semiconductor wafer formed of silicon, for example. The sample 116 is a substrate having a line pattern made of a conductive body such as metal formed on the surface thereof. The exposure apparatus 100 of the present embodiment exposes a resist formed on the line pattern in order to cleave and finely machine (e.g. form electrodes, wires, and/or vias in) the line pattern.

The stage section 110 includes a stage apparatus 112 and a stage position detecting section 114. The stage apparatus 112 has the sample 116 mounted thereon and moves the sample 116 in the XY plane shown in FIG. 1. The stage apparatus 112 may be an XY stage, or may be a combination including one or more of a Z stage, a rotating stage, and a tilting stage in addition to the XY stage.

The stage apparatus 112 moves in a predetermined direction, which is the longitudinal direction of the line pattern formed on the sample 116. The stage apparatus 112 has the sample 116 mounted thereon such that the longitudinal direction of the line pattern is substantially parallel to the movement direction of the stage, which is the X direction or the Y direction, for example. The present embodiment describes an example in which the stage apparatus 112 is an XY stage that moves in both the X direction and the Y direction, and the sample 116 is mounted such that the longitudinal direction of the line pattern is substantially parallel to the X direction, as shown in FIG. 1.

The stage position detecting section 114 detects the position of the stage apparatus 112. The stage position detecting section 114 detects the position of the stage by irradiating the moving stage with laser light and detecting the reflected light, for example. The stage position detecting section 114 preferably detects the position of the stage with an accuracy of approximately 1 nm or better.

The column section 120 irradiates the sample 116 mounted on the stage section 110 with a charged particle beam having electrons and ions. The present embodiment describes an example in which the column section 120 radiates an electron beam. The column section 120 of the present embodiment is a beam generating section that generates a plurality of charged particle beams having different irradiation positions in the width direction of the line pattern formed on the sample 116. The column section 120 includes a device 10, an electron gun 20, an aperture plate 30, a beam deforming section 40, a stopping plate 70, an adjusting section 80, and an alignment section 82.

The device 10 deforms and deflects the charged particle beams input thereto. The device 10 includes an aperture layer 50 and a deflection layer 60. The aperture layer 50 and the deflection layer 60 are described further below.

The electron gun 20 emits electrons using an electric field or heat, and applies a predetermined electric field to the emitted electrons to accelerate the electrons in the direction of the sample 116, which is the −Z direction in FIG. 1, thereby outputting the electron beam. The electron gun 20 may apply a predetermined acceleration voltage, e.g. 50 keV, to output the electron beam. The electron gun 20 may be provided along a vertical line that is parallel to the Z axis from the front surface of the sample 116, which is parallel to the XY plane.

The aperture plate 30 is provided between the electron gun 20 and the sample 116, and blocks a portion of the electron beam emitted by the electron gun 20. The aperture plate 30 has a circular aperture 32, for example, and blocks a portion of the electron beam with the aperture 32 while allowing the remaining portion of the electron beam to pass. The center of the aperture 32 may be formed in a manner to intersect a vertical line connecting the electron gun 20 and the sample 116. In other words, the aperture plate 30 passes an electron beam within a predetermined emission angle range, from within the electron beam emitted from the electron gun 20.

The beam deforming section 40 is provided between the aperture plate 30 and the sample 116, and deforms the substantially circular cross-sectional shape of the electron beam passed by the aperture plate 30. The beam deforming section 40 may be an electron lens such as an electrostatic quadrupole electrode, for example, and deforms the cross-sectional shape of the electron beam in a manner to become an elliptical shape that extends in one direction. In the example of FIG. 1, the beam deforming section 40 deforms the cross-sectional shape of the electron beam in a manner to have a cross-sectional shape that extends in a direction parallel to the Y axis.

The aperture layer 50 is provided between the beam deforming section 40 and the sample 116, passes a portion of the electron beam having the cross-sectional shape deformed by the beam deforming section 40, and blocks the remaining portion of this electron beam. The aperture layer 50 has a plurality of first apertures 52 lined up in one direction, and blocks a portion of the electron beam with these first apertures 52 while passing the rest of the electron beam.

In the example of FIG. 1, the first apertures 52 are lined up with predetermined intervals therebetween in the direction parallel to the Y axis, and are cut out in a manner to form a plurality of electron beams having cross-sectional shapes that extend in the direction parallel to the Y axis. The aperture layer 50 receives the electron beam input thereto and outputs a resulting electron beam group (referred to as an "array beam" in the present embodiment) in an array corresponding to the first apertures 52.

The deflection layer 60 is provided between the aperture layer 50 and the sample 116, and switches whether each of the plurality of charged particle beams output by the aperture layer 50 irradiates the sample 116. Specifically, the deflection layer 60 switches whether each beam in the array beam is deflected to have an orientation differing from the direction toward the sample 116. The deflection layer 60 includes a plurality of apertures 62 that correspond respectively to the beams in the array beam and are lined up in one direction, and a plurality of blanking electrodes 64 that correspond respectively to the beams in the array beam and apply an electric field within the apertures 62.

In the example of FIG. 1, the apertures 62 are lined up at predetermined intervals in the direction parallel to the Y axis, and each beam of the array beam is passed independently. For example, when voltage is not supplied to a blanking electrode 64, no electric field is applied to the electron beam in the corresponding aperture 62, and therefore the electron beam incident to this aperture 62 is passed in the direction toward the sample 116 without being deflected (this is referred to as a "beam ON" state). Furthermore, when voltage is supplied to a blanking electrode 64, an electric field is generated in the corresponding aperture 62, and therefore the electron beam incident to this aperture 62 is deflected in a direction differing from the direction in which the electron beam travels toward the sample 116 (this is referred to as a "beam OFF" state).

The stopping plate 70 is provided between the deflection layer 60 and the sample 116, and blocks the electron beams deflected by the deflection layer 60. The stopping plate 70 includes an aperture 72. The aperture 72 may have a substantially elliptical shape or rectangular shape that is extended in one direction, and the center of the aperture 72 may be formed to intersect a straight line connecting the electron gun 20 and the sample 116. In the example of FIG. 1, the aperture 72 has a shape that extends in the direction parallel to the Y axis.

The aperture 72 passes the electron beams that have been passed without being deflected by the deflection layer 60, and prevents the progression of electron beams that have been deflected by the deflection layer 60. Specifically, the column section 120 combines the deflection layer 60 and the stopping plate 70 and controls the voltage supplied to the blanking electrode 64, thereby enabling the column section 120 to switch (blanking operation) whether each electron beam included in the array beams irradiates the sample 116 (the beam ON state) or does not irradiate the sample 116 (the beam OFF state).

The adjusting section 80 is provided between the stopping plate 70 and the sample 116, deflects the plurality of charged particle beams, and adjusts the irradiation position of the array beam irradiating the sample 116. The adjusting section 80 may include a deflector that deflects an electron beam by applying an electric field corresponding to a drive signal input thereto to the electron beam passing therethrough, and may adjust the irradiation position of the array beam by deflecting the array beam. The adjusting section 80 may include one or more electromagnetic coils, and adjust the irradiation position of the array beam by applying a magnetic field to the array beam.

The alignment section 82 aligns an electron beam that has passed through a first aperture 52 of the aperture layer 50 with an aperture 62 of the deflection layer 60. The alignment section 82 may include a deflector that deflects the electron beam by generating an electrical field or magnetic field in a predetermined direction within the XY plane of FIG. 1. Using the electrical field or magnetic field generated in the XY plane, the alignment section 82 deflects the electron beam that has passed through the first aperture 52 of the aperture layer 50, thereby aligning the electron beam with the position of the aperture 62 of the deflection layer 60. Furthermore, the alignment section 82 may be a drive section that moves the deflection layer 60 in the XY plane of FIG. 1 relative to the aperture layer 50. In this case, the alignment section 82 moves the deflection layer 60 relative to the aperture layer 50 to align the position of the aperture 62 of the deflection layer 60 with the passing position of the electron beam that has been passed by the first aperture 52 of the aperture layer 50.

The column section 120 according to the present embodiment described above generates a plurality of electron beams oriented in a predetermined direction, and switches whether each electron beam irradiates the sample 116. In the column section 120, the orientation direction of each of the plurality of electron beams is determined by the direction in which the beam deforming section 40 deforms the cross-sectional shape of the beam, the arrangement direction of the first apertures 52 of the aperture layer 50, the arrangement direction of the apertures 62 of the deflection layer 60 and of the corresponding blanking electrodes 64, and the like.

When these directions substantially match the width direction of the line pattern, which is orthogonal to the movement direction of the stage apparatus 112, the column section 120 mounts the sample 116 such that the movement direction of the stage apparatus 112 substantially matches the longitudinal direction of the line pattern on the sample 116, and therefore a plurality of electron beams are generated with different irradiation positions in the width direction of the line pattern. The present embodiment describes an example in which the column section 120 radiates the array beam oriented in the Y direction, which is a direction perpendicular to the line pattern that is substantially parallel to the X direction.

The CPU 130 controls the overall operation of the exposure apparatus 100. The CPU 130 may have a function of an input terminal that inputs manipulation instructions from a user. The CPU 130 may be a computer, a work station, or the like. The CPU 130 is connected to the exposure control section 140, and controls the exposure operation of the exposure apparatus 100 according to input from the user. For example, the CPU 130 is connected to each component of the exposure control section 140 via a bus 132, and handles control signals and the like.

The exposure control section 140 is connected to the stage section 110 and the column section 120, and controls the stage section 110 and the column section 120 to perform the exposure operation on the sample 116, according to the control signals and the like received from the CPU 130. Furthermore, the exposure control section 140 may be connected to the external storage section 90 via the bus 132, and handle data of patterns stored in the external storage section 90, for example. Instead, the external storage section 90 may be connected directly to the CPU 130. Instead, the exposure control section 140 may include a storage section that stores pattern data or the like therein. The exposure control section 140 includes the storage section 150, a selecting section 160, an irradiation control section 170, a deflection amount determining section 180, and a scanning control section 190.

The storage section 150 stores a cut pattern, which is a pattern for the exposure by the exposure apparatus 100, in order to cut the line pattern formed on the sample 116 and a via pattern, which is a pattern for the exposure by the exposure apparatus 100, in order to form vias in the sample 116. The storage section 150 receives the information concerning the cut pattern and the via pattern from the external storage section 90 and stores this information, for example. The storage section 150 may receive the information concerning the cut pattern and the via pattern input from the user via the CPU 130 and store this information.

The storage section 150 stores configuration information of the sample 116 and configuration information of the line pattern formed on the sample 116. The storage section 150 may store measurement results obtained by performing a measurement in advance as the configuration information, before beginning the exposure operation. For example, the storage section 150 stores, as the configuration information of the sample 116, information concerning sources of positioning error such as contraction (deformation error caused by the manufacturing process), rotational error (caused by transport or the like), warping of the substrate or the like, and height distribution of the sample 116.

Furthermore, the storage section 150 stores, as the configuration information of the line pattern, information relating to misalignment between the irradiation position of the array beam and the position of the line pattern. The storage section 150 preferably sets the configuration information to be configuration information of the sample 116 and configuration information of the line pattern obtained by measuring the sample 116 mounted on the stage apparatus 112. Instead, the storage section 150 may store a past measurement result of the sample 116 or a measurement of another sample in the same batch, for example.

The selecting section 160 is connected to the storage section 150, reads the information of the cut pattern and the via pattern, and identifies the designation of the irradiation positions in the longitudinal direction on the line pattern. The selecting section 160 selects at least one charged particle beam to irradiate the sample 116, from among the plurality of charged particle beams generated by the column section 120, at the designated irradiation positions in the longitudinal direction on the line pattern. The selecting section 160 selects the electron beams to be radiated from within the array beam based on the information of the cut pattern and the via pattern, and provides the irradiation control section 170 with the selection result.

The irradiation control section 170 is connected to the selecting section 160 and receives the selection result of the selecting section 160. The irradiation control section 170 is connected to the column section 120, and controls the at least one selected charged particle beam to irradiate the sample 116. The irradiation control section 170 supplies the blanking electrodes 64 of the deflection layer 60 with a signal for switching between the ON state and the OFF state of the electron beam, via the amplifier 172. The amplifier 172 may include an amplification circuit that has a predetermined amplification degree.

The deflection amount determining section 180 is connected to the storage section 150, reads the configuration information of the sample 116 and the configuration information of the line pattern, calculates the adjustment amount by which the irradiation position of the array beam is to be adjusted according to the information concerning the position error of the sample 116 and the irradiation position error of the array beam, and determines a deflection amount corresponding to this adjustment amount. The deflection amount determining section 180 is connected to the column section 120 and adjusts the irradiation position of the array beam based on the determined deflection amount. The deflection amount determining section 180 supplies the adjusting section 80 with a control signal for deflecting the array beam according to the determined deflection amount, via the deflecting section drive circuit 182. Here, the deflecting section drive circuit 182 converts the control signal corresponding to the deflection amount output from the deflection amount determining section 180 into a drive signal that is input to the adjusting section 80.

The scanning control section 190 is connected to the stage section 110 and scans the irradiation positions of the plurality of charged particle beams along the longitudinal direction of the line pattern. The scanning control section 190 according to the present embodiment performs scanning with the array beam along the longitudinal direction of the line pattern by moving the stage apparatus 112 with the sample 116 mounted thereon in a direction substantially parallel to the X direction. The scanning control section 190 supplies a control signal for moving the stage apparatus 112, via the stage drive circuit 192. The stage drive circuit 192 converts the control signal corresponding to the movement amount and the movement direction output from the scanning control section 190 into a corresponding drive signal for stage apparatus 112.

The scanning control section 190 is connected to the stage position detecting section 114 and receives a detection result of the stage position of the stage apparatus 112. The scanning control section 190 may acquire the movement amount by which the stage apparatus 112 actually moved and the position error of the stage, i.e. the movement error, based on the detection result, and provide feedback for the movement control of the stage apparatus 112. Furthermore, the scanning control section 190 may be connected to the deflection amount determining section 180 and adjust the paths traveled by the charged particle beams according to the movement error of the sample 116 caused by the stage section 110.

The scanning control section 190 is connected to the selecting section 160 and the irradiation control section 170, and supplies the selecting section 160 and the irradiation control section 170 with the position information of the stage apparatus 112. The irradiation control section 170 acquires the timing at which the line pattern of the sample 116 is irradiated by the array beam, based on the position information of the stage apparatus 112.

The scanning control section 190 moves the irradiation position of the array beam in the width direction of the line pattern as well, and performs scanning such that a predetermined region on the surface of the sample 116 becomes the possible irradiation region of the array beam. The following describes an example of the scanning control section 190 performing scanning with the array beam, using FIG. 2.

Figure 2:
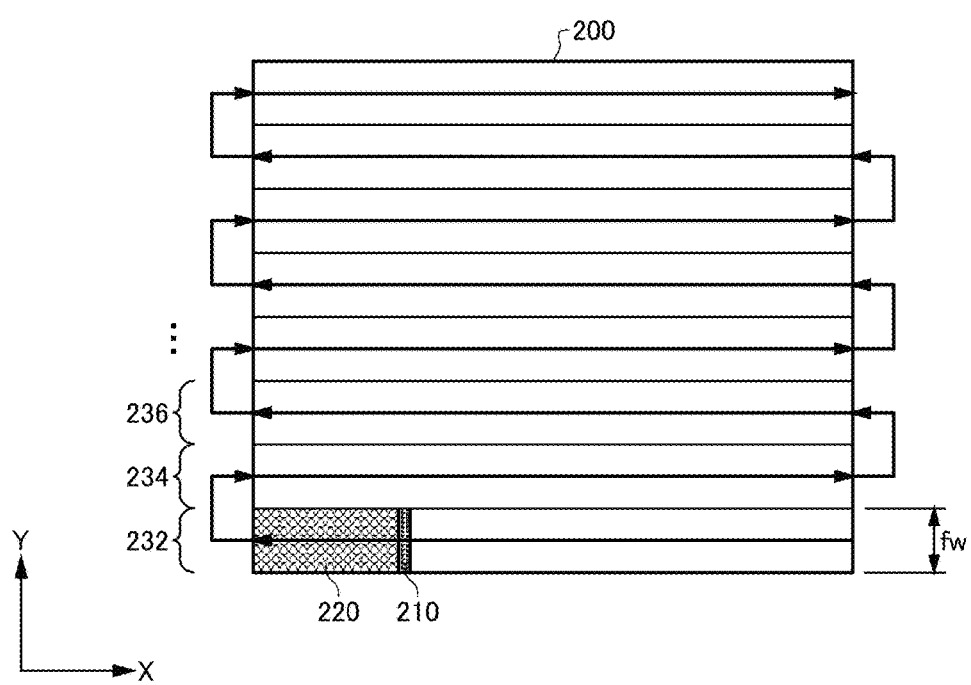
FIG. 2 shows an example of a possible irradiation region 200 formed in a portion of the surface of the sample 116 by the exposure apparatus 100 according to the present embodiment scanning with the array beam.

An example of a possible irradiation region 200 formed in a portion of the surface of the sample 116 by the exposure apparatus 100 according to the present embodiment scanning with the array beam is shown. FIG. 2 shows the surface of the sample 116 substantially parallel to the XY plane, and fw indicates the beam width of the total of all the electron beams lined up in the Y direction of the array beam radiated by the exposure apparatus 100, i.e. the width direction of the line pattern. Here, the beam width fw is substantially 30 μm, for example.

The scanning control section 190 moves the sample 116 in the longitudinal direction of the line pattern using the stage section 110, in a state where the paths travelled by the charged particle beams are maintained. FIG. 2 shows an example in which the scanning control section 190 moves the stage apparatus 112 in the −X direction. In this way, the surface of the sample 116 is scanned by the irradiation position 210 of the array beam scan in the +X direction, and the array beam sets a band-shaped region 220 as the possible irradiation region of the electron beams. Specifically, the scanning control section 190 moves the stage apparatus 112 a predetermined distance in the X direction to set a first frame 232 as the possible irradiation region. Here, the first frame 232 has a surface area of 30 μm by 30 mm, for example.

Next, the scanning control section 190 moves the stage apparatus 112 in the −Y direction by the beam width fw of the beam array, and then moves the stage apparatus 112 back in the +X direction by an amount equal to the predetermined distance that the stage apparatus 112 was previously moved in the −X direction. As a result, a portion of the surface of the sample 116 differing from the first frame 232 is scanned by the irradiation position 210 of the array beam in the −X direction, and a second frame 234 adjacent to the first frame 232 in the +Y direction and having substantially the same surface area as the first frame 232 is set as the possible irradiation region. In the same manner, the scanning control section 190 moves the stage apparatus 112 in the −Y direction by the beam width fw of the beam array, and then moves the stage apparatus 112 in the −X direction by the predetermined distance and sets a third frame 236 as the possible irradiation region.

In this way, the scanning control section 190 moves the stage apparatus 112 back and forth in the X direction, which is the longitudinal direction of the line pattern, and sets a predetermined region on the surface of the sample 116 to be the possible irradiation region 200 of the array beam. Here, the scanning control section 190 sets a 30×30 mm square region to be the possible irradiation region 200.

The present embodiment describes an example in which the scanning control section 190 sets a square region to be the possible irradiation region 200 of the array beam by moving the stage apparatus 112 back and forth, but the present invention is not limited to this, and the scanning control section 190 may perform scanning by deflecting the radiation direction of the array beam. In this case, the scanning control section 190 may supply a deflection amount corresponding to the distance to be scanned to the deflection amount determining section 180 and perform scanning with the array beam. Furthermore, the present embodiment describes an example in which the scanning control section 190 sets the possible irradiation region 200 of the array beam to have a rectangular shape, but the present invention is not limited to this, and a predetermined region formed by the scanning with the array beam may be set as the possible irradiation region 200 of the array beam.

The exposure apparatus 100 according to the present embodiment described above exposes the sample 116 by radiating the array beam corresponding to the irradiation position on the line pattern while moving the stage apparatus 112 back and forth in the X direction, which is the longitudinal direction of the line pattern. In other words, the exposure apparatus 100 irradiates the line pattern within the possible irradiation region 200 of the array beam with charged particle beams at an exposure position corresponding to the cut pattern and the via pattern to be formed. The exposure operation of the exposure apparatus 100 is described below using FIG. 3.

Figure 3:
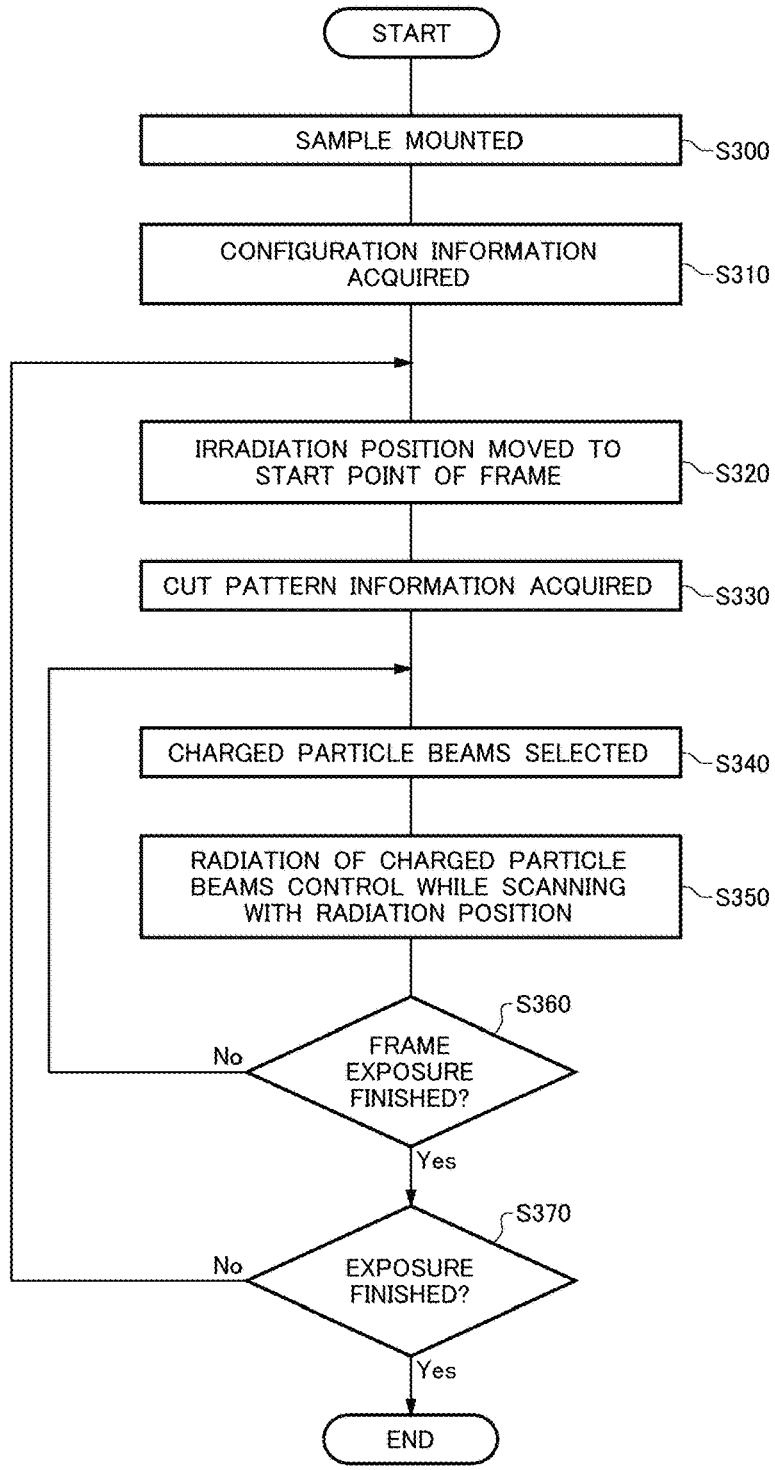
FIG. 3 shows an operational flow of the exposure apparatus 100 according to the present embodiment.

FIG. 3 shows an operational flow of the exposure apparatus 100 according to the present embodiment. The present embodiment describes an example in which the exposure apparatus 100 exposes a cut pattern on the line pattern on the surface of the sample 116, by performing the processes from S300 to S370.

First, the sample 116 that has the line pattern formed thereon and a resist applied thereto is mounted on the stage section 110 (S300). Next, the exposure apparatus 100 acquires the configuration information of the mounted sample 116 and the configuration information of the line pattern (S310). The exposure apparatus 100 stores the acquired configuration information in the storage section 150.

The exposure apparatus 100 acquires the configuration information of the sample 116 and/or the configuration information of the line pattern by observing a plurality of positioning markers or the like provided on the sample 116, for example. In this case, the exposure apparatus 100 may acquire the configuration information of the line pattern by irradiating the positioning markers with the electron beams and detecting the irradiation position of the electron beams and the positions of the positioning markers from a surface image of the sample 116 obtained by detecting secondary electrons or reflected electrons, for example.

The exposure apparatus 100 may acquire the configuration information of the sample 116 by irradiating the positioning markers with laser light, for example, and detecting the reflected light or scattered light. When the exposure apparatus 100 acquires the configuration information of the sample 116 and the configuration information of the line pattern through measurement in this way, the exposure apparatus 100 may further include a detecting section for detecting secondary electrons or reflected electrons, a laser light radiating apparatus, and a light detecting section, for example.

Next, the scanning control section 190 moves the stage apparatus 112 to a position corresponding to a start point of a frame to be exposed, such that the irradiation position of the array beam is positioned at this start point (S320). When the scanning control section 190 moves the stage apparatus 112 in the +X direction, i.e. moves the irradiation position of the array beam in the −X direction, and exposes the frame, the edge of this frame on the +X direction side is set as the start point of the frame.

When the scanning control section 190 moves the stage apparatus 112 in the −X direction, i.e. moves the irradiation position of the array beam in the +X direction, and exposes the frame, the edge of this frame on the −X direction side is set as the start point of the frame. When the scanning control section 190 moves the stage apparatus 112 back and forth for each frame in the X direction, which is the longitudinal direction of the line pattern, the scanning control section 190 switches between using the edge in the −X direction and using the edge on the +X direction side as the start point of the frame in an alternating manner.

At the beginning stage of the exposure operation, the scanning control section 190 may set the start point of the frame to be a predetermined position. For example, the scanning control section 190 sets the edge on the −X direction side of the frame positioned farthest on the −Y direction side to be the start point of the frame.

Figure 4:
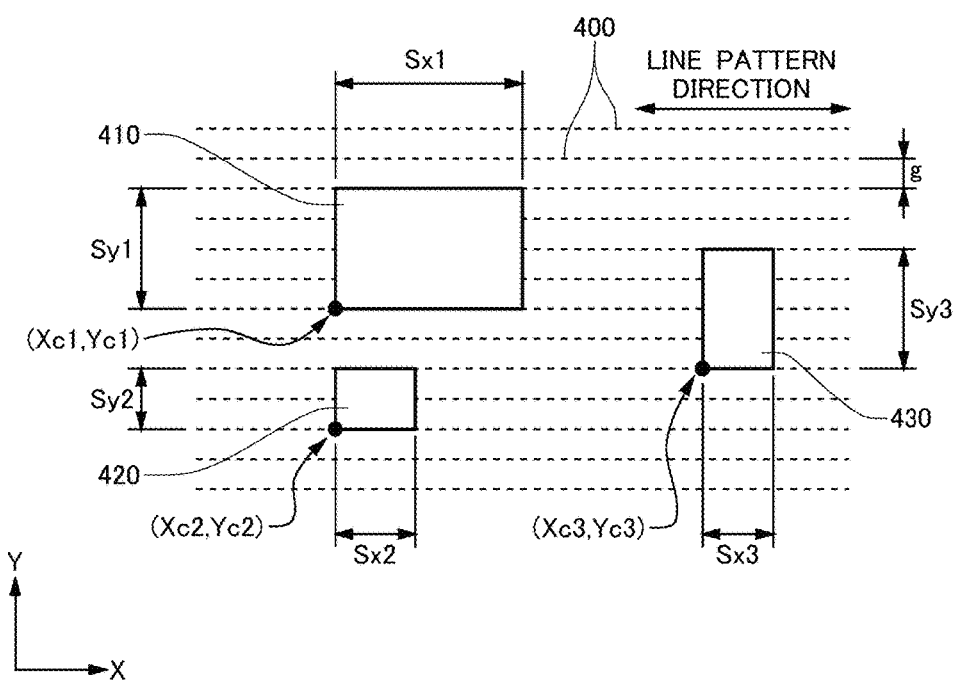
FIG. 4 shows an example of the information of the cut pattern to be formed on the sample 116.

Next, the selecting section 160 acquires from the storage section 150 the information of the cut pattern within the frame to be exposed (S330). FIG. 4 shows an example of the information of the cut pattern to be formed on the sample 116. The information of the cut pattern may include data concerning the position and the size of the cut pattern displayed as a rectangle. FIG. 4 shows an example in which the cut pattern data is the length of two sides of the cut pattern and the coordinates of predetermined portions (each vertex on the −X direction side and −Y direction side, which are the vertices in the lower left portions in the drawing).

More specifically, the {(position), size} of the cut pattern data of a first pattern 410 is shown as {(Xc1, Yc1), Sx1, Sy1}. Similarly, the {(position), size} of the cut pattern data of a second pattern 420 is shown as {(Xc2, Yc2), Sx2, Sy2} and the {(position), size} of the cut pattern data of a third pattern 430 is shown as {(Xc3, Yc3), Sx3, Sy3}.

The X direction in FIG. 4 substantially matches the longitudinal direction of the line pattern, which is the target on which the cut pattern is being imposed. In FIG. 4, the dotted lines parallel to the X direction and arranged at intervals of g in the Y direction are a grid 400 used for designing the line pattern and the cut pattern. For example, the interval g is the grid width, and this grid width g is substantially equal to the minimum value of the line width in the short direction of the line pattern, i.e. the Y direction. Furthermore, when the line pattern has a plurality of different line widths, the line widths are all values that are n times the grid width g, where n is a natural number greater than or equal to 1. Furthermore, the pattern interval in the Y direction between adjacent line patterns is a value that is m times the grid width g, where m is a natural number greater than or equal to 1.

In the same manner, the length of the cut pattern in the Y direction and the pattern interval in the Y direction are each values that are natural number (greater than or equal to 1) multiples of the grid width g. For example, the length of the first pattern 410 in the Y direction is substantially equal to 4 g, the length of the second pattern 420 in the Y direction is substantially equal to 2 g, and the pattern interval in the Y direction between the first pattern 410 and the second pattern 420 is substantially equal to 2 g. Furthermore, in the example of FIG. 4, the Y coordinates of the cut pattern are designed to be substantially equal on the grid 400. In this way, the cut pattern and the line pattern according to the present embodiment have Y coordinates that are designed using the coordinate values of the grid 400 as a reference.

Figure 5:
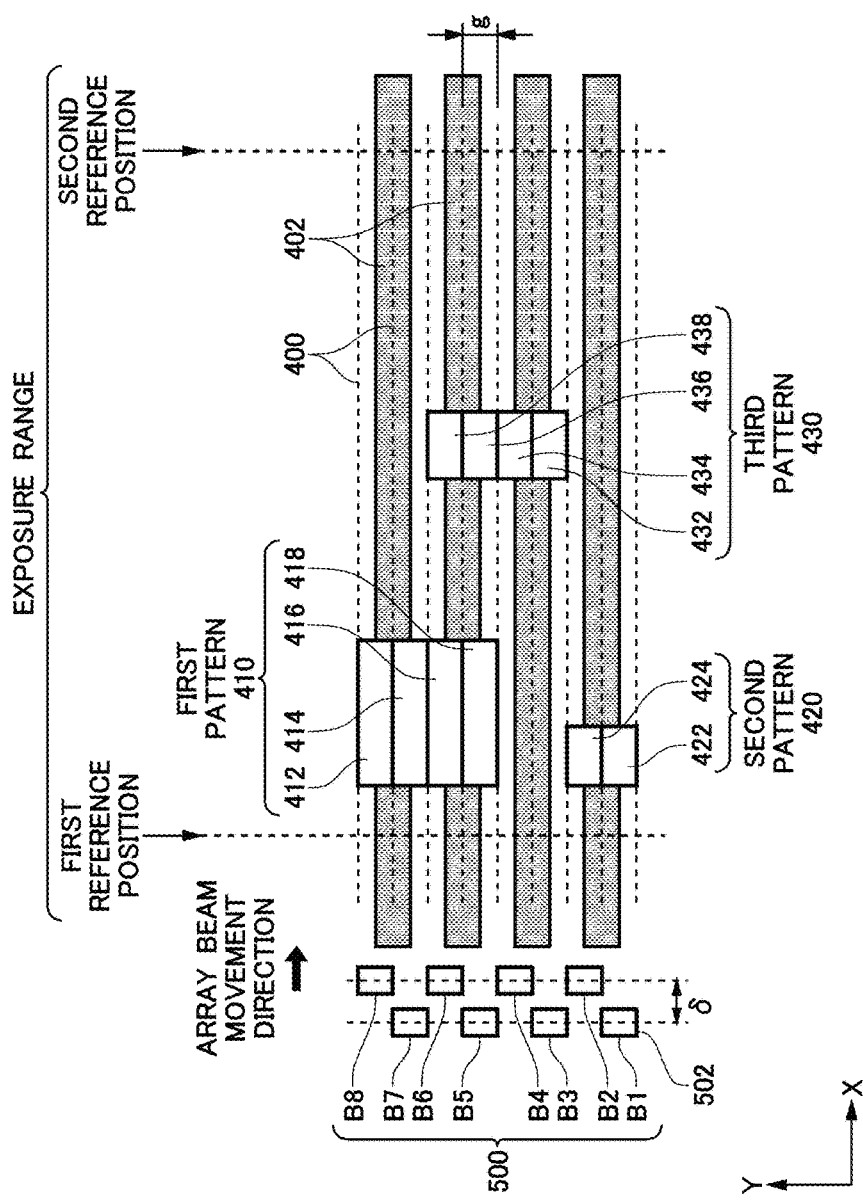
FIG. 5 shows an example in which the scanning control section 190 according to the present embodiment moves the irradiation position of the array beam to the start point of a frame.

FIG. 5 shows an example in which the scanning control section 190 according to the present embodiment moves the irradiation position of the array beam to the start point of a frame, i.e. the edge of the frame on the −X side. Specifically, FIG. 5 is a view of the XY plane showing an example of the positional relationship between the line pattern 402 formed on the surface of the sample and the irradiation position of the array beam 500. Furthermore, FIG. 5 is a view of the XY plane showing examples of the positional relationship between the line pattern 402 and the cut pattern shown in FIG. 4.

The example of FIG. 5 shows a case in which one frame includes four line patterns 402, and the line width of each line pattern 402 and the intervals between adjacent line patterns 402 are both substantially equal to the grid width g of the grid 400. In the drawing, the first pattern 410 is a pattern in which two line patterns 402 from the uppermost portion are cut simultaneously, the second pattern 420 is a pattern in which a line pattern 402 of the bottommost portion is cut, and the third pattern 430 is a pattern in which two line patterns 402 in the center are cut simultaneously.

FIG. 5 shows an example in which the array beam 500 includes a total of eight electron beams B1 to B8. The array beam 500 irradiates each of a plurality of irradiation regions 502 on the sample 116 with an electron beam. The beam width in the width direction of the line patterns, i.e. the Y direction, of each of the electron beams B1 to B8 is substantially equivalent to the grid width g. Furthermore, the irradiation positions of the electron beams B1 to B8 on the sample 116 are arranged at intervals of the grid width g in the Y direction, resulting in a total width of substantially 8 g, such that a range with a width of substantially 8 g in the frame is exposed. In other words, the array beam 500 has a beam width in the Y direction that is a value equal to the product of the number of electron beams in the array beam 500 and the grid width g, and a frame having a width in the Y direction substantially equal to this beam width is exposed.

Here, when the irradiation positions of the plurality of electron beams can be arranged in one column with intervals of the grid width g therebetween, the column section 120 may irradiate the sample 116 with the array beams 500 lined up in this column. Instead, the column section 120 may irradiate the sample 116 with array beams 500 for which the irradiation positions of the electron beams are arranged in a plurality of columns.

FIG. 5 shows an example in which the array beam 500 includes electron beams that are lined up in two columns with an interval 6 therebetween in the longitudinal direction of the line pattern. The irradiation positions of the electron beams included in each column are arranged with distances substantially equal to the grid width g therebetween in the width direction of the line pattern. Accordingly, the column including the odd-numbered electron beams B1, B3, B5, and B7, which is referred to as the "first column," has a total width in the Y direction of substantially 7 g. Similarly, the column including the even-numbered electron beams, which is referred to as the "second column," has a total width in the Y direction of substantially 7 g.

At step S320 when the scanning control section 190 moves the irradiation position of the array beam 500 to the start point of the frame, the irradiation positions of the electron beams are arranged respectively between the corresponding grid lines. FIG. 5 shows an example in which the irradiation position of the electron beam B1 arranged first from the −Y direction side is positioned between the first and the second grid lines from the −Y direction side, and the irradiation position of the electron beam Bn arranged n-th from the −Y direction side is positioned between the n-th grid line and the (n+1)-th grid line from the −Y direction side.

In the manner described above, in order to expose the cut pattern designed using the grid 400 coordinate values as a reference, the scanning control section 190 moves the irradiation position of the array beam 500 to positions based on this grid 400. Therefore, the scanning control section 190 can expose a frame having a width of nxg between the corresponding first to (n+1)-th grid lines, by scanning with the irradiation position of the array beam 500s including n electron beams along the longitudinal direction of the line pattern.

Next, the selecting section 160 selects the charged particle beams to be used for the exposure (S340). The selecting section 160 may determine the cut pattern for the exposure based on the information of the irradiation position of the array beam received from the scanning control section 190.

The Y coordinates of the cut pattern are designed to be substantially equal on the grid 400, and therefore the selecting section 160 can perform exposure with the first pattern 410 having a width of 4 g by radiating the four electron beams B5 to B8 while scanning with the irradiation position of the array beam 500 along the longitudinal direction of the line pattern, for example.

In other words, in order to perform exposure of the first pattern 410, the selecting section 160 selects the four electron beams B5 to B8 as the electron beams to be used for the exposure. Then, the electron beam B5 is used for exposure of a partial pattern 418 of the first pattern 410, the electron beam B6 is used for exposure of a partial pattern 416 of the first pattern 410, the electron beam B7 is used for exposure of a partial pattern 414 of the first pattern 410, and the electron beam B8 is used for exposure of a partial pattern 412 of the first pattern 410.

Here, the selecting section 160 can select the electron beams to be used for the exposure according to the values of the Y coordinates of the cut pattern. For example, in response to the Y coordinate values of the second pattern 420 being positioned between the first and third grid lines from the −Y direction side, the selecting section 160 selects the electron beams B1 and B2 having irradiation positions in this region. Furthermore, in response to the Y coordinate values of the third pattern 430 being positioned between the third and seventh grid lines from the −Y direction side, the selecting section 160 selects the electron beams B3 to B6 having irradiation positions in this region.

In this way, the electron beam B1 is used for exposure of a partial pattern 422 of the second pattern 420, and the electron beam B2 is used for exposure of a partial pattern 424 of the second pattern 420. Furthermore, the electron beam B3 is used for exposure of a partial pattern 432 of the third pattern 430, the electron beam B4 is used for exposure of a partial pattern 434 of the third pattern 430, the electron beam B5 is used for exposure of a partial pattern 436 of the third pattern 430, and the electron beam B6 is used for exposure of a partial pattern 438 of the third pattern 430.

The selecting section 160 detects the irradiation positions that are to be irradiated by the selected electron beams. The selecting section 160 detects the irradiation positions to be irradiated according to the cut pattern as designated irradiation positions. The selecting section 160 detects the designated irradiation positions according to the time that has passed from when the irradiation positions of a plurality of charged particle beams have passed by predetermined reference positions in the longitudinal direction of the line pattern.

FIG. 5 shows an example of two reference positions determined in advance in the longitudinal direction of the line pattern, which are a first reference position and a second reference position. Specifically, the region between the first reference position and the second reference position is set as the exposure range, and the selecting section 160 detects the designated irradiation position of each of the plurality of electron beams according to the time that has passed from when the irradiation position of the corresponding array beam 500 has passed the first reference position.

In addition to this, three or more reference positions may be set in advance in the longitudinal direction of the line pattern. Specifically, a single frame is divided into a plurality of exposure regions, and the selecting section 160 may detect the designated irradiation position of each of the plurality of electron beams for each exposure range. In this case, the selecting section 160 detects each designated irradiation position according to the reference position that was most recently passed from among the plurality of reference positions in the longitudinal direction of the line pattern by the irradiation position of the charged particle beam and the time that has passed from when this reference position was passed. The selection of the electron beams by the selecting section 160 and the detection of the irradiation positions is described below using FIGS. 6 and 7.

Figure 6:
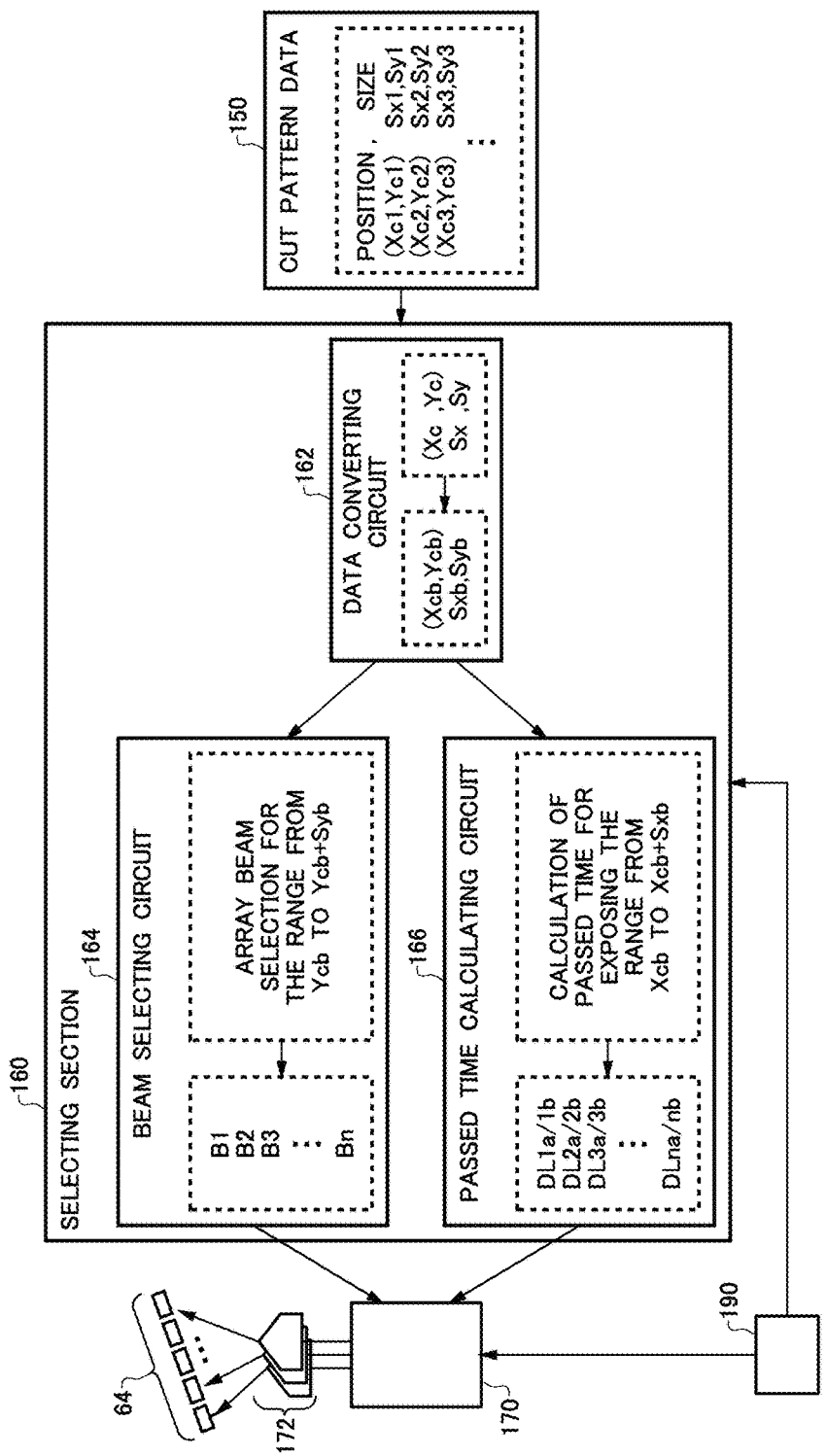
FIG. 6 shows an example of the selecting section 160 according to the present embodiment.

FIG. 6 shows an example of the selecting section 160 according to the present embodiment. The selecting section 160 includes a data converting circuit 162, a beam selecting circuit 164, and a passed time calculating circuit 166.

The data converting circuit 162 selects the cut pattern data from the storage section 150 and converts this cut pattern data into a coordinate system relating to the configuration of the line pattern on the sample 116. The data converting circuit 162 acquires (Xci, Yci), Sxi, Syi (i=1, 2, 3, etc.) as the cut pattern data from the storage section 150, for example, and converts this data into (Xcbi, Ycbi), Sxbi, Sybi (i=1, 2, 3, etc.) that is exposure data in a coordinate system on the sample 116. Here, the Y coordinate values Yci and Syi of the cut pattern data are values that are integer multiples of the grid width g, and therefore the values Ycbi and Sybi resulting from the conversion are also discrete values.

The data conversion performed by the data converting circuit 162 is intended to correct the rotational error caused when the sample 116 is loaded onto the stage apparatus 112 and the deformation error of the sample 116 caused by the device manufacturing processes such as etching and film formation of the sample 116, for example. In other words, if the precision of the stage apparatus 112, the precision of the manufacturing process, and the like are sufficiently high, this correction is a data conversion for correcting the distance error to be approximately 10 ppm or less and the angle error to be approximately 1 mrad or less.

For example, in a case where the pattern width Sxi, Syi is from tens to hundreds of nanometers, even if this data conversion is performed, the resulting change will be less than 0.1 nm. In other words, in this case, when the processing is performed to cut away 0.1 nm or less, the expressions Sxi=Sxbi and Syi=Sybi are established. Accordingly, when the rotational error and the deformation error occurring for the sample 116 are within a predetermined range, the selecting section 160 may omit the data conversion relating to Sxi and Syi performed by the data converting circuit 162.

The beam selecting circuit 164 selects the electron beams to be used based on the exposure data (Xcb, Ycb), Sxb, Syb. For example, in a case where the Y direction coordinates of the grid 400 shown in FIG. 5 are Yc1, Yc2, . . . , Yc8 from the −Y direction side, the beam selecting circuit 164 selects the electron beam B1 as the electron beam to be used for the exposure in the Y coordinate range from Yc1 to Yc2. Specifically, for the cut pattern positioned from the coordinate Ycb to the coordinate Ycb+Syb, the beam selecting circuit 164 selects the electron beams B1, B2, . . . , Bn to be used for the exposure to be the electron beams corresponding to these coordinates.

For each of the electron beams B1 to Bn selected by the beam selecting circuit 164, the passed time calculating circuit 166 detects the timing for switching the electron beam to the ON state or the OFF state. The passed time calculating circuit 166 detects this timing based on the X coordinate of the exposure data, and outputs the result as the passed time, for example. Here, the passed time is the time until each electron beam included in the array beam 500 is set to the ON state or the OFF state, with the time at which the array beam passed the reference position as the origin.

The scanning control section 190 scans with the array beam 500 in the +X direction or the −X direction, which is the longitudinal direction of the line pattern. In a case where the cut pattern data is expressed by the exposure data (Xcb, Ycb), Sxb, Syb and the scanning control section 190 scans with the array beam 500 in the +X direction, by causing an electron beam to be in the ON state at the time when the irradiation position of the electron beam corresponding to the X-axis coordinate reaches the position Xcb and causing the electron beam to be in the OFF state when the irradiation position reaches the position Xcb+Sxb, it is possible to perform exposure within the pattern region of the cut pattern with this electron beam. In other words, the passed time calculating circuit 166 detects the passed time to be the time from a timing when the array beam 500 has passed the first reference position on the −X side of the exposure range to a timing when the electron beam has been switched to the ON state and the OFF state.

On the other hand, when the scanning control section 190 scans with the array beam 500 in the −X direction, by causing an electron beam to be in the ON state at the time when the irradiation position of the electron beam corresponding to the X-axis coordinate reaches the position Xcb+Sxb and causing the electron beam to be in the OFF state when the irradiation position reaches the position Xcb, it is possible to perform exposure within the pattern region of the cut pattern with this electron beam. In this case, the passed time calculating circuit 166 detects the passed time to be the time from a timing when the array beam 500 has passed the second reference position on the +X side of the exposure range to the timing when the electron beam has been switched to the ON state and the OFF state.

When a plurality of reference positions are set within a frame, the passed time calculating circuit 166 may detect the passed time to be from the timing when the reference position most recently passed among the plurality of reference positions was passed to the timing when the electron beam is switched to the ON state and the OFF state. For example, the passed time calculating circuit 166 calculates the passed time according to the velocity at which the scanning control section 190 scans with the array beam 500 in the longitudinal direction of the line pattern. In this case, the scanning control section 190 preferably performs exposure while continuously moving the array beam 500 in the frame, and when performing scanning in the longitudinal direction of the line pattern, the scanning control section 190 may control the velocity V of the array beam 500 such that the velocity V changes smoothly and at least does not become zero.

When the scanning control section 190 scans with the array beam 500 in the +X direction, the first reference position has an X coordinate S, the pattern start position of the cut pattern for the exposure is Xcb, and the pattern width, i.e. the pattern width in the X-axis direction, is Sxb, the passed time calculating circuit 166 can calculate the passed time (DLa) until the electron beam is set to the ON state using the expression shown below. The passed time calculating circuit 166 may receive information concerning the velocity V from the scanning control section 190.

$$DLa=(Xcb-S)/V \quad \text{Expression 1:}$$

The passed time calculating circuit 166 can calculate the passed time (DLb) until the electron beam is set to the OFF state at the pattern end position Xcb+Sxb using the expression shown below.

$$DLb=(Xcb+Sxb-S)/V \quad \text{Expression 2:}$$

For the electron beams B1, B2, . . . , Bn selected by the beam selecting circuit 164, the passed time calculating circuit 166 respectively calculates the passed times until the electron beams are set to the ON state to be DL1a, DL2a, DLna. Furthermore, the passed time calculating circuit 166 respectively calculates the passed times until the electron beams are set to the OFF state to be DL1b, DL2b, . . . , DLnb.

In this way, the beam selecting circuit 164 and the passed time calculating circuit 166 respectively perform the selection of the electron beams to be used for the exposure and the detection of the passed time, corresponding to the cut pattern for the exposure. The selecting section 160 supplies the irradiation control section 170 with the selection result of the beam selecting circuit 164 and the detection result of the passed time calculating circuit 166.

Next, the exposure control section 140 controls the radiation of the charged particle beams while scanning with the irradiation position of the array beam 500 (S350). Specifically, the scanning control section 190 scans with the irradiation position of the array beam 500 with a velocity V by moving the stage apparatus 112, and supplies the irradiation control section 170 with the irradiation position of the array beam 500 based on the position detection result of the stage position detecting section 114. The irradiation control section 170 supplies a control signal to the corresponding blanking electrode 64 of the deflection layer 60 in order to control the radiation of a selected electron beam, according to the irradiation position of the array beam 500 and the passed time.

Figure 7:
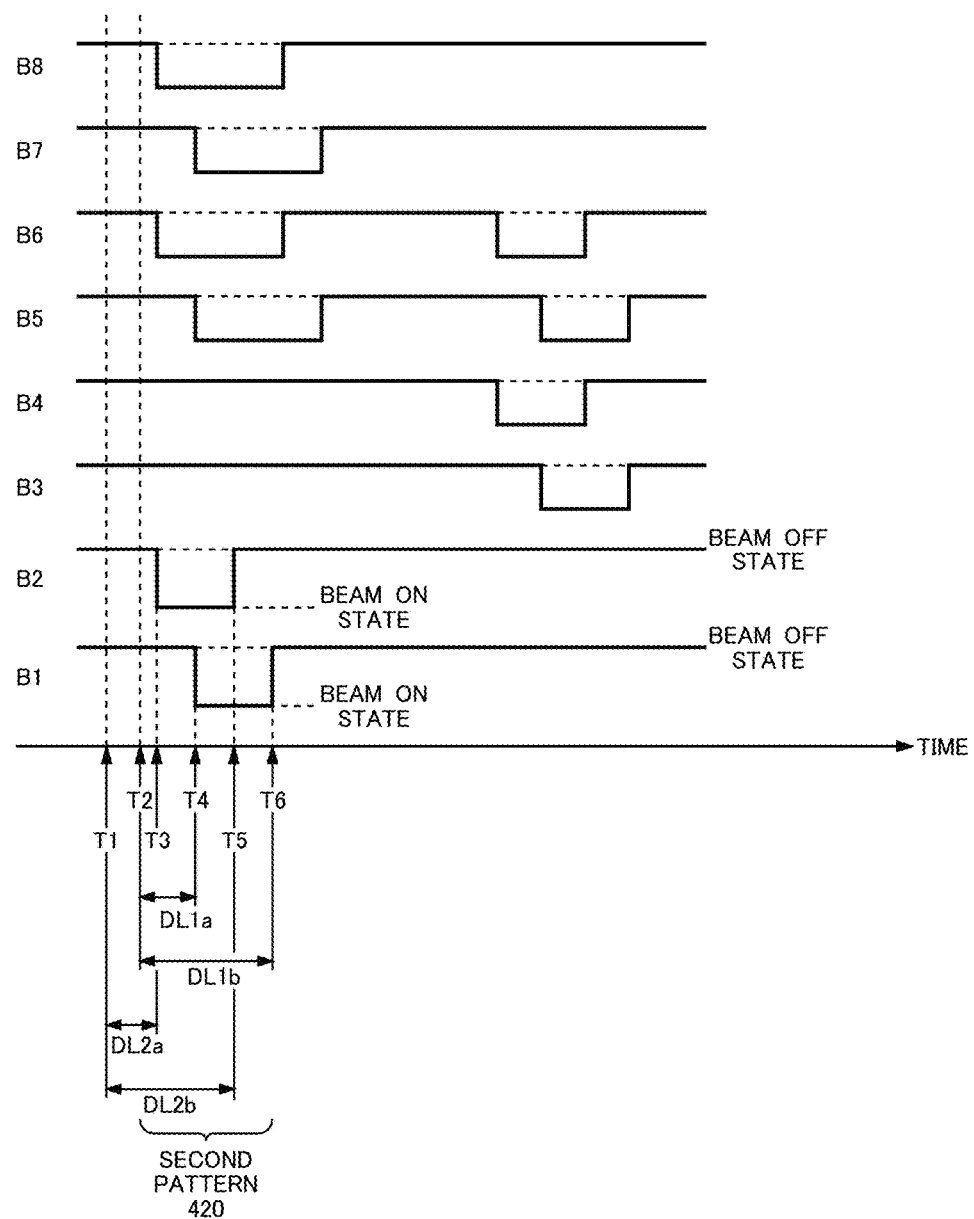
FIG. 7 is an exemplary timing chart for the control signals supplied to the blanking electrodes 64 by the irradiation control section 170 according to the present embodiment.

FIG. 7 is an exemplary timing chart for the control signals supplied to the blanking electrodes 64 by the irradiation control section 170 according to the present embodiment. Specifically, FIG. 7 shows the timing of the blanking operation for the electron beams B1 to B8 for exposure of the cut pattern in the exposure range shown in FIG. 5. In FIG. 7, the horizontal axis indicates time and the vertical axis indicates voltage.

The eight control signals shown in FIG. 7 are examples of the control signals supplied to the blanking electrodes 64 corresponding to the electron beams B1 to B8. Specifically, when the voltage level of a control signal is in a high state, the irradiation control section 170 supplies a signal voltage corresponding to this control signal to the blanking electrode 64, thereby causing the corresponding electron beam to be deflected and setting this electron beam to the OFF state. Furthermore, when the voltage level of a control signal is in a low state, the irradiation control section 170 does not supply a signal voltage to the blanking electrode 64, thereby causing the corresponding electron beam to be passed and setting this electron beam to the ON state.

On the time axis, the timing shown by T1 is the timing at which the second column including the electron beams B2, B4, B6, and B8 passes the first reference position. Furthermore, the timing shown by T2 is the timing at which the first column including the electron beams B1, B3, B5, and B7 passes the first reference position. Here, T2−T1=δ/V.

The signals shown by B1 and B2 in FIG. 7 are the control signals for exposure of the second pattern 420 of the cut pattern shown in FIG. 5 using the electron beams B1 and B2. The selecting section 160 selects the electron beams B1 and B2 based on the cut pattern data of the second pattern 420, and detects the passed time. FIG. 7 shows an example in which the irradiation control section 170 generates the control signals B1 and B2 according to the passed time.

The irradiation control section 170 switches the electron beam B1 from the OFF state to the ON state at the timing T4, which occurs when the passed time DL1a has passed from the timing T2 at which the irradiation position of the electron beam B1 passed the first reference position. The irradiation control section 170 switches the electron beam B1 from the ON state to the OFF state at the timing T6, which occurs when the passed time DL1b has passed from the timing T2.

The irradiation control section 170 switches the electron beam B2 from the OFF state to the ON state at the timing T3, which occurs when the passed time DL2a has passed from the timing T1 at which the irradiation position of the electron beam B2 passed the first reference position. The irradiation control section 170 switches the electron beam B2 from the ON state to the OFF state at the timing T5, which occurs when the passed time DL2b has passed from the timing T1.

In this way, the irradiation control section 170 can generate the control signals for controlling radiation of the electron beams according to the passed time and the selection result of the selecting section 160 and the position information of the irradiation position of the scanning performed by the scanning control section 190. By supplying the blanking electrodes 64 with the control signals generated by the irradiation control section 170, the column section 120 can expose the second pattern 420 of the cut pattern on the sample 116.

Similarly, the irradiation control section 170 generates the control signals of the electron beams B3 to B8 selected by the selecting section 160 to expose the first pattern 410 and the third pattern 430 on the sample 116. In the manner described above, the irradiation control section 170 according to the present embodiment controls the operation of switching the electron beams to the ON state and the OFF state based on the time that has passed from the timing at which the irradiation position passes a reference position. Therefore, there are cases where the length of the exposure range from the first reference position to the second reference position is defined according to the number of bits of a clock that counts the passed time.

The smallest period of this clock may be set according to a predetermined position resolution and stage velocity. For example, in a case where the data step of the exposure position is 0.125 nm, when the position resolution is set to a value of 0.0625 nm that is half of the data step and the maximum movement velocity of the stage is set to 50 mm/sec, the clock period is desired to have a minimum of 1.25 ns. Here, when the number of count bits of the clock counter is 12 bits (=4096), the count can be performed up to a passed time of approximately 5 μs. During this passed time, the stage moves 0.25 μm with the maximum movement velocity of 50 mm/sec.

In this way, the exposure apparatus 100 of the present embodiment can design the exposure range length in advance based on the clock period. By providing a plurality of reference positions and controlling the radiation of the electron beams based on the passed time from each reference position, the exposure apparatus 100 can expose a frame having an exposure range that is longer than the above exposure range.

Specifically, for all of the exposure ranges included in one frame, the exposure control section 140 scans with the irradiation position of the array beam 500 and controls the radiation of the electron beams based on the passed time from the reference position for each reference position that is passed. In other words, the exposure control section 140 performs exposure by controlling the plurality of electron beams while scanning with the irradiation position of the array beam 500 in the exposure range from the first reference position to the subsequent second reference position shown in the example of FIG. 5.

In a case where a further reference position is included in the frame, the exposure control section 140 continues exposing this frame (S360: No) and returns to step S340 for selecting the charged particle beams, in order to expose the next exposure range from the second reference position to the third reference position. The exposure control section 140 repeats the operations from S340 to S350 for this frame, until there are no more reference positions passed by the irradiation position of the array beam 500. While the scanning control section 190 is scanning the exposure range from the reference position most recently passed by the irradiation position of the array beam 500 to the subsequent reference position, the selecting section 160 may perform the detection of the passed time and the selection of the electron beams corresponding to a following exposure range that follows after the subsequent reference position. In this way, the exposure control section 140 can perform exposure of adjacent exposure ranges continuously over time.

In a case where there are no further reference positions in the frame (S360: Yes), the exposure control section 140 ends the exposure of this frame. In a case where there is a subsequent frame to be exposed (S370: No), the process returns to S320 and irradiation position of the array beam 500 is moved to the start point of the subsequent frame and exposure of this subsequent frame is performed. The exposure control section 140 repeats the operations from S320 to S360 until there are no more frames to be exposed. In a case where there are no more frames to be exposed (S370: Yes), the exposure control section 140 ends the exposure of this frame.

In the manner described above, the exposure apparatus 100 according to the present embodiment divides the possible irradiation region 200 of the array beam into frames and, for each frame, repeats the exposure operation of controlling the plurality of electron beams while scanning with the irradiation position of the array beam 500 in the longitudinal direction of the line pattern, thereby exposing the possible irradiation region 200. By moving the sample 116 with the stage apparatus 112, the exposure apparatus 100 can form a plurality of different possible irradiation regions 200 on the surface of the sample 116, and can therefore perform exposure of the entire line pattern formed on the surface of the sample 116 with a single column section 120.

Figure 8:
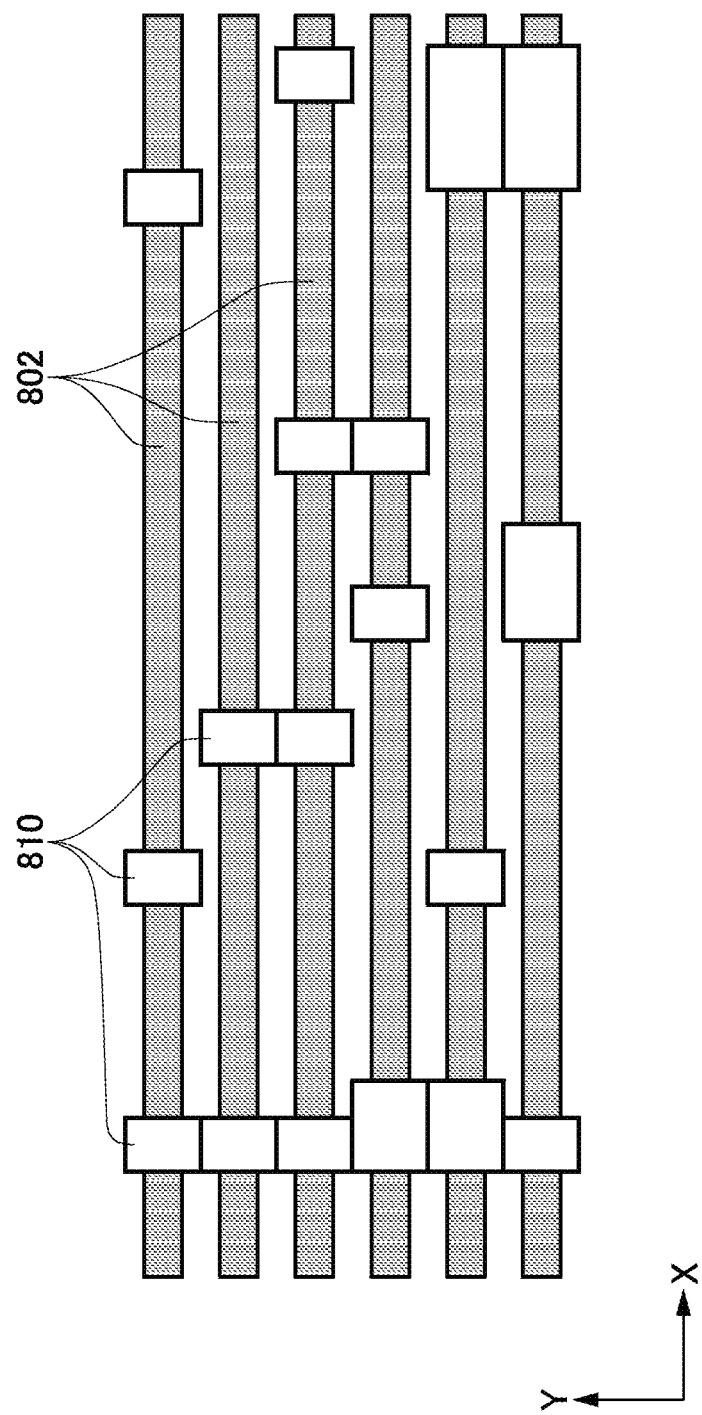
FIG. 8 shows an exemplary line pattern 802 formed on the surface of the sample 116.

FIG. 8 shows an exemplary line pattern 802 formed on the surface of the sample 116. The exposure apparatus 100 according to the present embodiment exposes the region displayed by the cut pattern 810 in the resist formed on the line pattern 802, by performing the operation described in FIG. 3. Through this exposure, the resist in the region of the cut pattern 810 can be removed, and therefore the line pattern 802 positioned at this cut pattern is exposed and the exposed line pattern 802 can be etched to form a fine wire pattern or the like.

Figure 9:
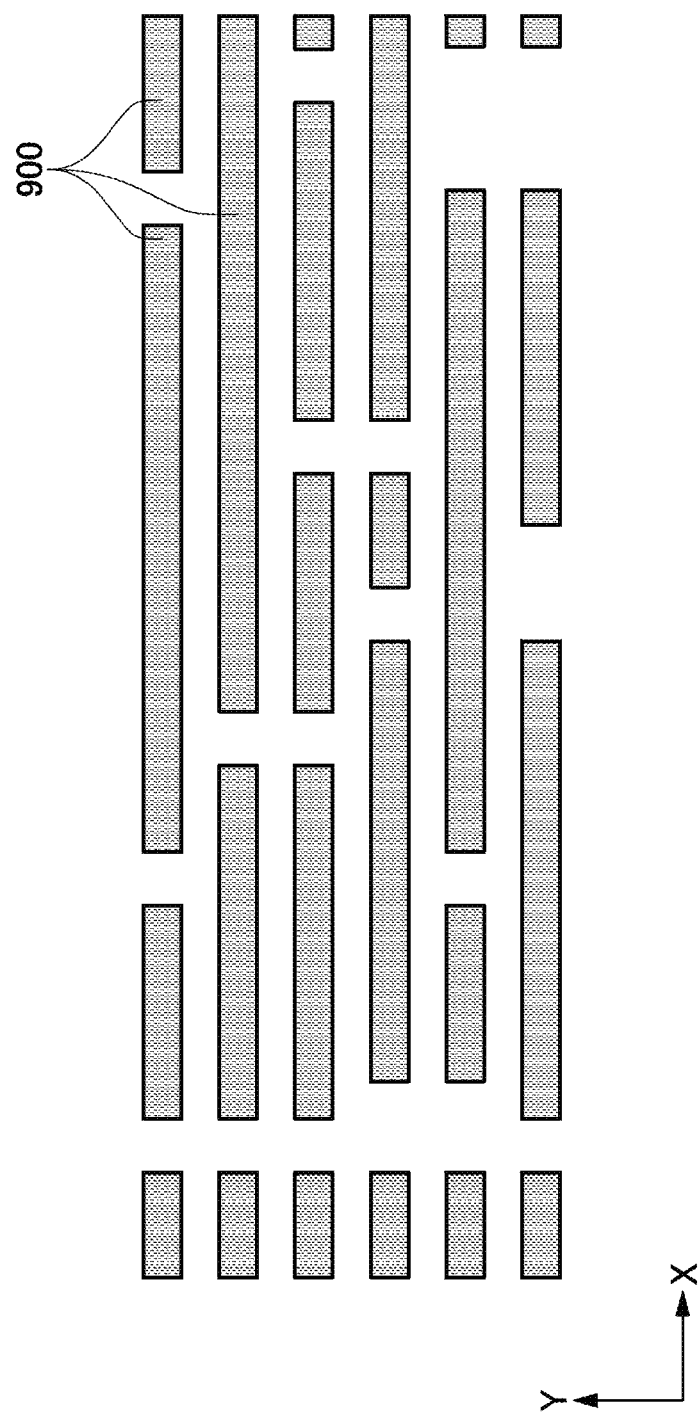
FIG. 9 shows an exemplary fine wire pattern 900 formed on the surface of the sample 116.

FIG. 9 shows an exemplary fine wire pattern 900 formed on the surface of the sample 116. With the exposure apparatus 100 according to the present embodiment, a finer wire pattern 900 can be formed by exposing the sample 116 on which the line pattern is formed in advance. For example, the line pattern 802 shown in FIG. 8 is a simple line and space pattern, and therefore it is possible to form the pattern with a line width and line interval of approximately 10 nm by using optical exposure technology. By using the exposure apparatus 100 according to the present embodiment that utilizes electron beams, this line pattern 802 can be machined, and therefore it is possible to form a fine wire pattern 900 that cannot be formed merely by optical exposure technology, such as a gate electrode. By using optical exposure technology to form the line pattern 802, it is possible to reduce the total machining time needed to form the fine wire pattern 900.

Furthermore, the coordinates of the cut pattern and the configuration of the irradiation position of the array beam 500 is based on the grid used for designing the line pattern 802, and therefore the exposure control section 140 can perform fine exposure with a simple control operation, without requiring complex feedback control. In the above description, the exposure apparatus 100 according to the present embodiment is described as an electron beam exposure apparatus that utilizes electron beams, but the present invention is not limited to this, and the present invention can be applied in the same manner to exposure apparatuses utilizing various types of charged particle beams. Furthermore, the present embodiment above describes an example of exposure of a cut pattern, but the present invention is not limited to this, and can be applied to the exposure of a via pattern in the same manner. The above is a description of the exposure operation and apparatus configuration of the exposure apparatus 100 that adopts a device 10. The device 10 provided in such an exposure apparatus 100 is described below.

Figure 10A:
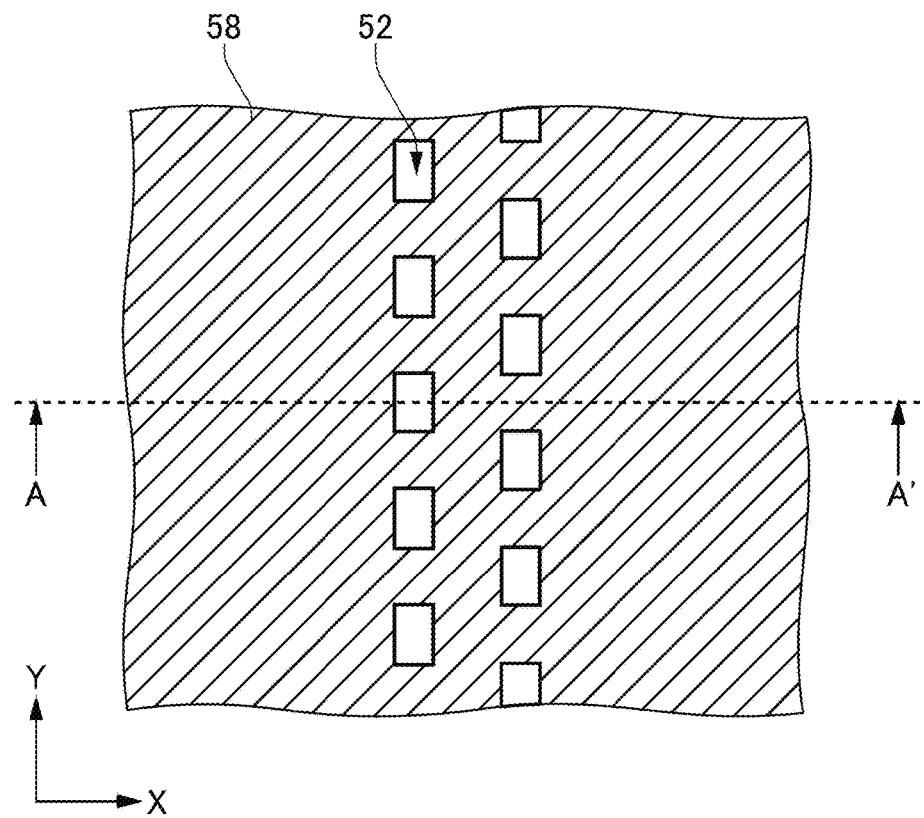
FIG. 10A shows an exemplary configuration of the aperture layer 50 included in the device 10 according to the present embodiment, in the XY plane.
Figure 10B:
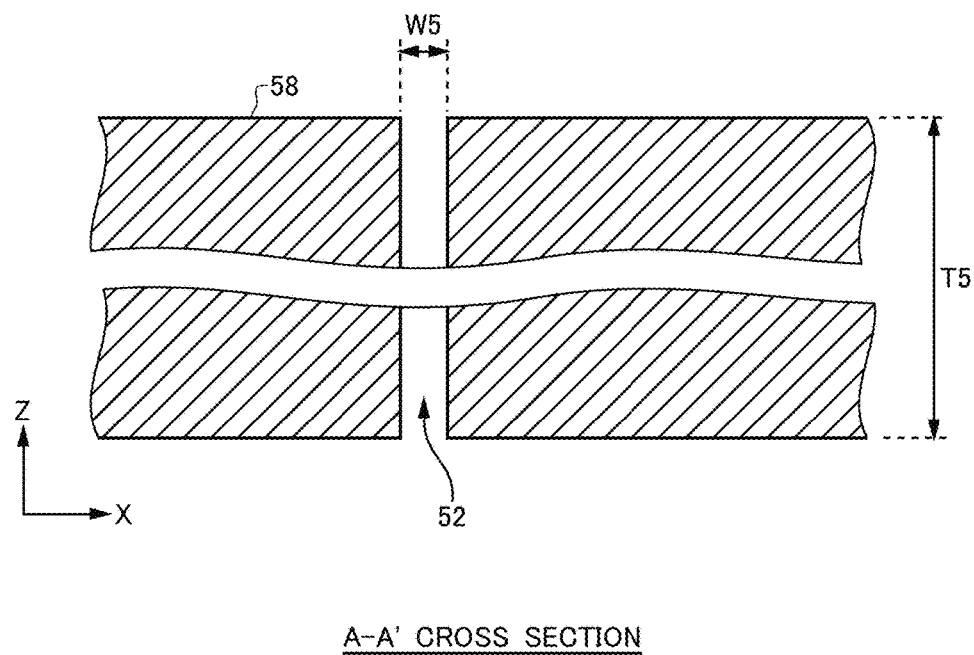
FIG. 10B shows an exemplary configuration of the aperture layer 50 according to the present embodiment, in a cross-sectional plane.

FIG. 10A shows an exemplary configuration of the aperture layer 50 included in the device 10 according to the present embodiment, in the XY plane. FIG. 10B shows an exemplary configuration of the aperture layer 50 according to the present embodiment, in a cross-sectional plane. FIG. 10A shows an example of the aperture layer 50 in the XY plane, as seen from the side of a first surface that is the surface of the device 10 to which the beam is incident. FIG. 10B is an exemplary cross-sectional view of the aperture layer 50 shown in FIG. 10A showing the AA' cross-sectional plane. The aperture layer 50 has a first aperture 52 and an aperture layer substrate 58.

The first aperture 52 is formed in the aperture layer substrate 58. As shown in the example of FIG. 10A, a plurality of first apertures 52 are provided at predetermined intervals in a direction substantially parallel to the Y axis. The first apertures 52 are formed as through-holes that penetrate through the aperture layer 50, and deform and pass the electron beam incident thereto from the first surface side of the device 10. For example, the first apertures 52 deform an electron beam whose cross-sectional shape in the XY plane extends in a direction substantially parallel to the Y axis into a plurality of electron beams having rectangular cross-sectional shapes. In other words, by passing the electron beam, the aperture layer 50 forms an overall array beam in which a plurality of electron beams having rectangular cross-sectional shapes are arrayed in the Y axis direction.

The internal diameter width W5 of each first aperture 52 determines the beam size of the beam deformed by passing through the first aperture 52. This beam size determined by the first aperture 52 is contracted by an electron lens system provided between the aperture layer 50 and the sample 116, thereby determining the beam size of each individual beam projected onto the sample 116. Accordingly, the internal diameter width W5 of each first aperture 52 may be set according to the beam size that is to be radiated onto the sample 116 and the contraction rate of the electronic lens system. For example, in a case where the required beam size on the sample 116 is approximately 10 nm and the contraction rate of the electron lens system is 1/60, the internal diameter width W5 of the first aperture 52 is set to approximately 600 nm.

The aperture layer substrate 58 blocks a portion of the electron beam incident thereto from the first surface side of the device 10. The thickness T5 of the aperture layer substrate 58 shown in FIG. 10B may be a thickness that stops the progression of the electron beam, or a thickness that sufficiently reduces the progression of the electron beam. The thickness capable of stopping the progression of the electron beam depends on the acceleration voltage of the electron beam and the material of the aperture layer substrate 58. For example, in a case where the material of the aperture layer substrate 58 is silicon and the acceleration voltage of the electron beam is 50 keV, the thickness T5 for stopping the progression of the electron beam is preferably greater than or equal to 10 μm.

Figure 11A:
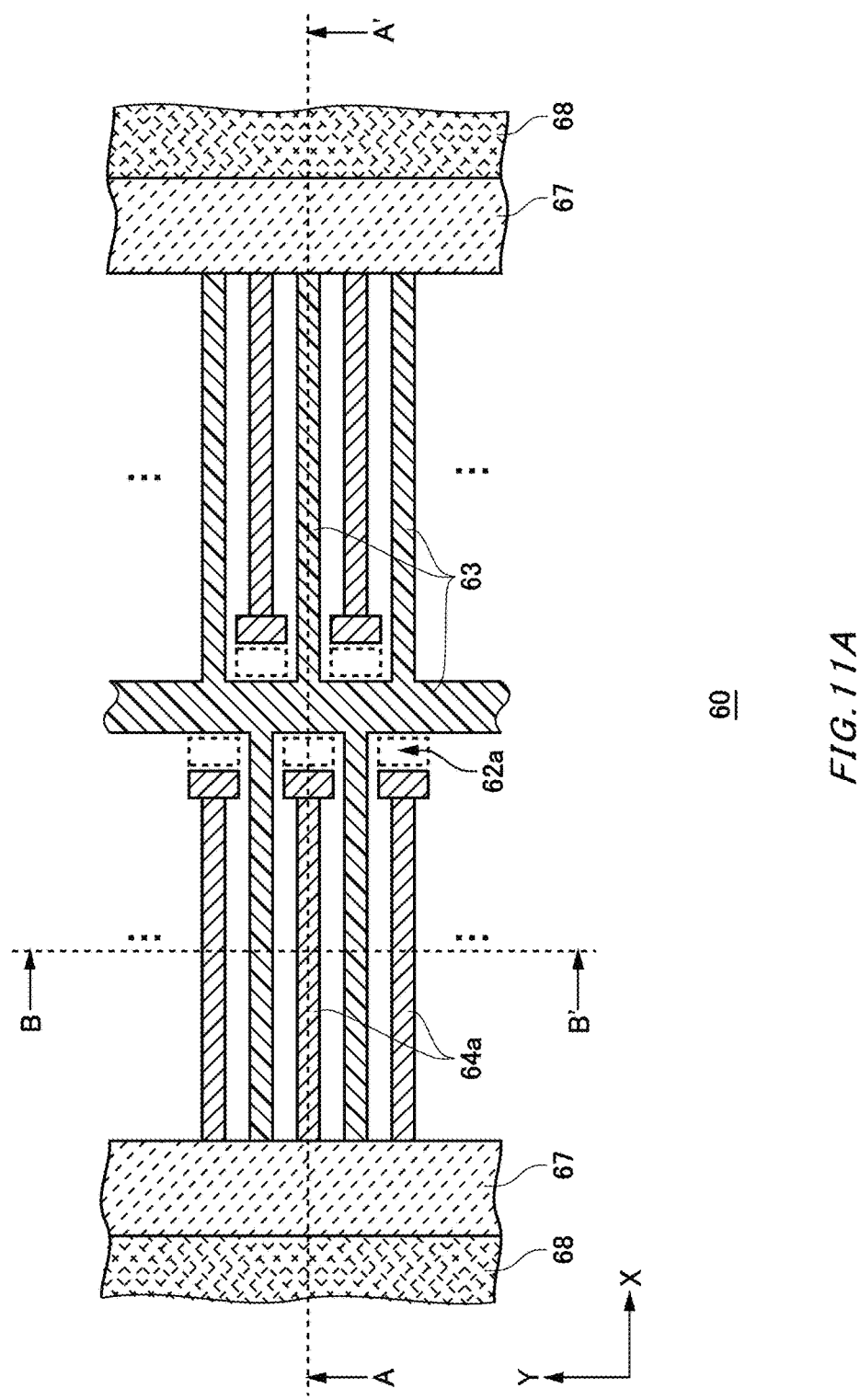
FIG. 11A shows an exemplary configuration of a plane of the deflection layer 60 in the device 10 according to the present embodiment.
Figure 11B:
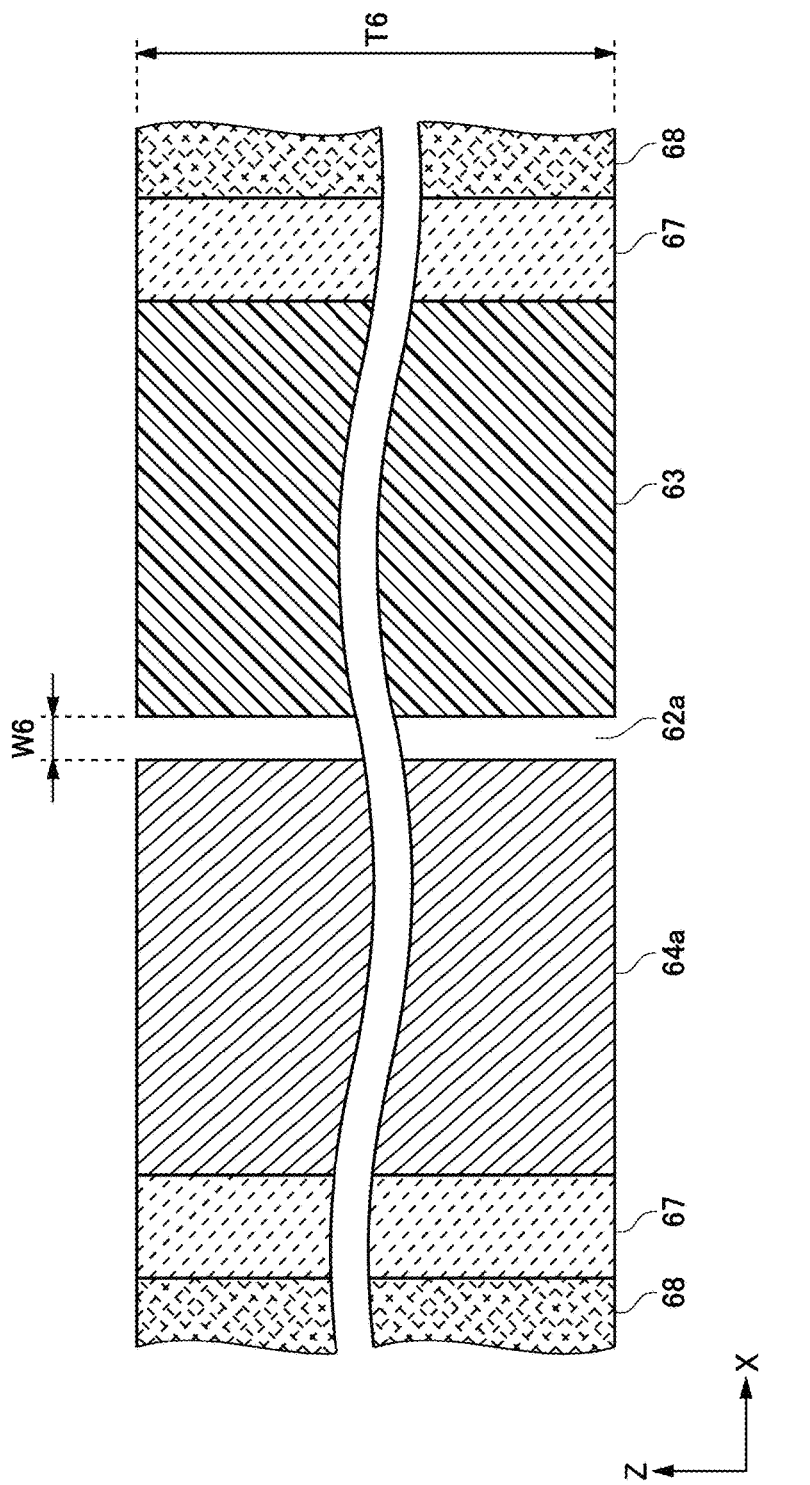
FIG. 11B shows an exemplary configuration of a first cross-sectional plane of the deflection layer 60 according to the present embodiment.
Figure 11C:
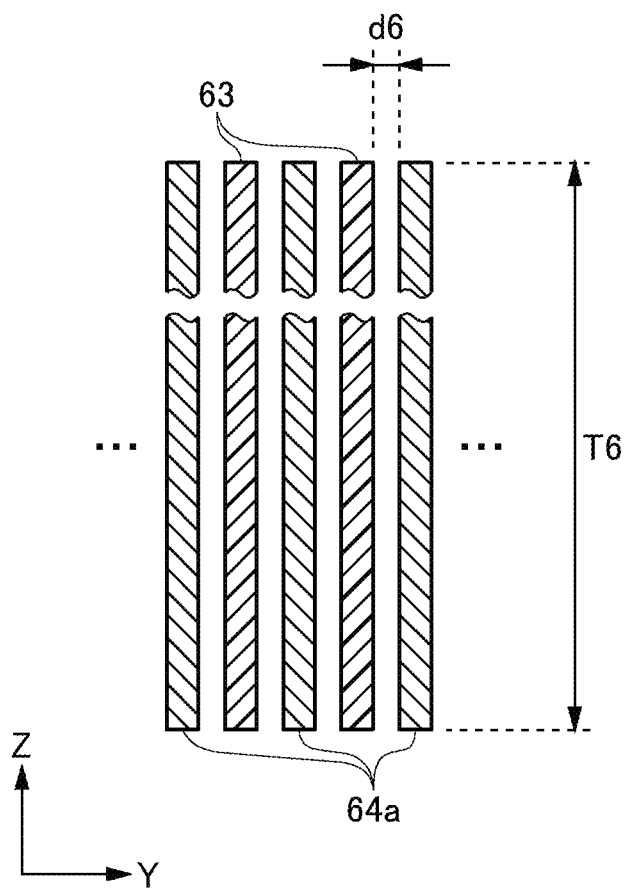
FIG. 11C shows an exemplary configuration of a second cross-sectional plane of the deflection layer 60 according to the present embodiment.

FIG. 11A shows an exemplary configuration of a plane of the deflection layer 60 in the device 10 according to the present embodiment. FIG. 11A is an example of an XY planar view of the deflection layer 60 as seen from the first surface side of the device 10. FIG. 11B shows an exemplary configuration of a first cross-sectional plane of the deflection layer 60 according to the present embodiment. FIG. 11B is an example of a cross-sectional view showing the AA' cross-sectional plane of the deflection layer 60 shown in FIG. 11A. FIG. 11C shows an exemplary configuration of a second cross-sectional plane of the deflection layer 60 according to the present embodiment. FIG. 11C is an example of a cross-sectional view showing the BB' cross-sectional plane of the deflection layer 60 shown in FIG. 11A.

The deflection layer 60 passes and deflects the electron beam that has passed through the aperture layer 50. The deflection layer 60 includes a beam passing space 62a, a first electrode section 63, a second electrode section 64a, an insulating section 67, and a deflection layer substrate 68. The beam passing space 62a is an example of the aperture 62 described in FIG. 1. The beam passing space 62a is described further below.

The first electrode sections 63 may be formed integrally, and connected to an external reference potential or the like to have an overall reference potential that is substantially the same, for example. The first electrode sections 63 include portion extending in the +X direction and the −X direction, and have comb-like teeth that respectively extend in the +X direction and the −X direction in the XY plane.

A plurality of second electrode sections 64a are provided individually in the deflection layer 60. The second electrode sections 64a are each electrically connected to the irradiation control section 170 via a corresponding amplifier 172 and supplied with a corresponding control voltage. In other words, the second electrode sections 64a are an example of the blanking electrodes 64 described in FIG. 1 and the like. A portion of the plurality of the second electrode sections 64a extend in the +X direction and have extended tip portions that face the first electrode sections 63 across the beam passing spaces 62a. The remaining portion of the plurality of second electrode sections 64a extend in the −X direction and have extended tip portions that face the first electrode sections 63 across the beam passing spaces 62a. The first electrode sections 63 and the second electrode sections 64a may include a silicon layer provided with conductivity.

The insulating section 67 cuts off the electrical connection between the first electrode sections 63 and the second electrode sections 64a, while holding the first electrode sections 63 and the second electrode sections 64a. In other words, the insulating section 67 creates electrical insulation by spatially distancing the first electrode sections 63 and the second electrode sections 64a from each other. FIG. 11A shows an example in which a portion of the second electrode sections 64a extend in the +X direction from the insulating section 67 on the −X side and the remaining second electrode sections 64a extend in the −X direction from the insulating section 67 on the +X side.

The deflection layer substrate 68 is a substrate formed by the beam passing spaces 62a, the first electrode sections 63, the second electrode sections 64a, and the insulating section 67 described above. In the deflection layer substrate 68, the through-holes are formed penetrating in the Z axis direction and the insulating section 67 is formed on the wall surfaces of the through-holes that are substantially parallel to the YZ plane and face in the +X direction and the −X direction, for example.

As shown in the AA' cross-sectional view of FIG. 11B, a first electrode section 63 and a second electrode sections 64a extending in opposite directions from each other in the X-axis direction have a space with a width of W6 between the tips thereof, which is the space that forms the beam passing space 62a, as described further below. Furthermore, as shown in the BB' cross-sectional view of FIG. 11C, the first electrode sections 63 and the second electrode sections 64a are arranged in an alternating manner with predetermined spaces d6 therebetween in the Y-axis direction. The first electrode sections 63 and the second electrode sections 64a are spatially distanced from each other by the spaces W6 at the electrode tips shown in FIG. 11B and the spaces d6 between the electrodes shown in FIG. 11C.

The width W6 is approximately equal to or greater than the internal diameter width W5 of the first aperture 52. The width W6 may be greater than approximately 500 nm, and may be 900 nm, for example. The space width d6 between the electrodes shown in FIG. 11C may be set to be approximately the same as the width W6. The space width d6 is approximately 500 nm, for example.

Figure 12:
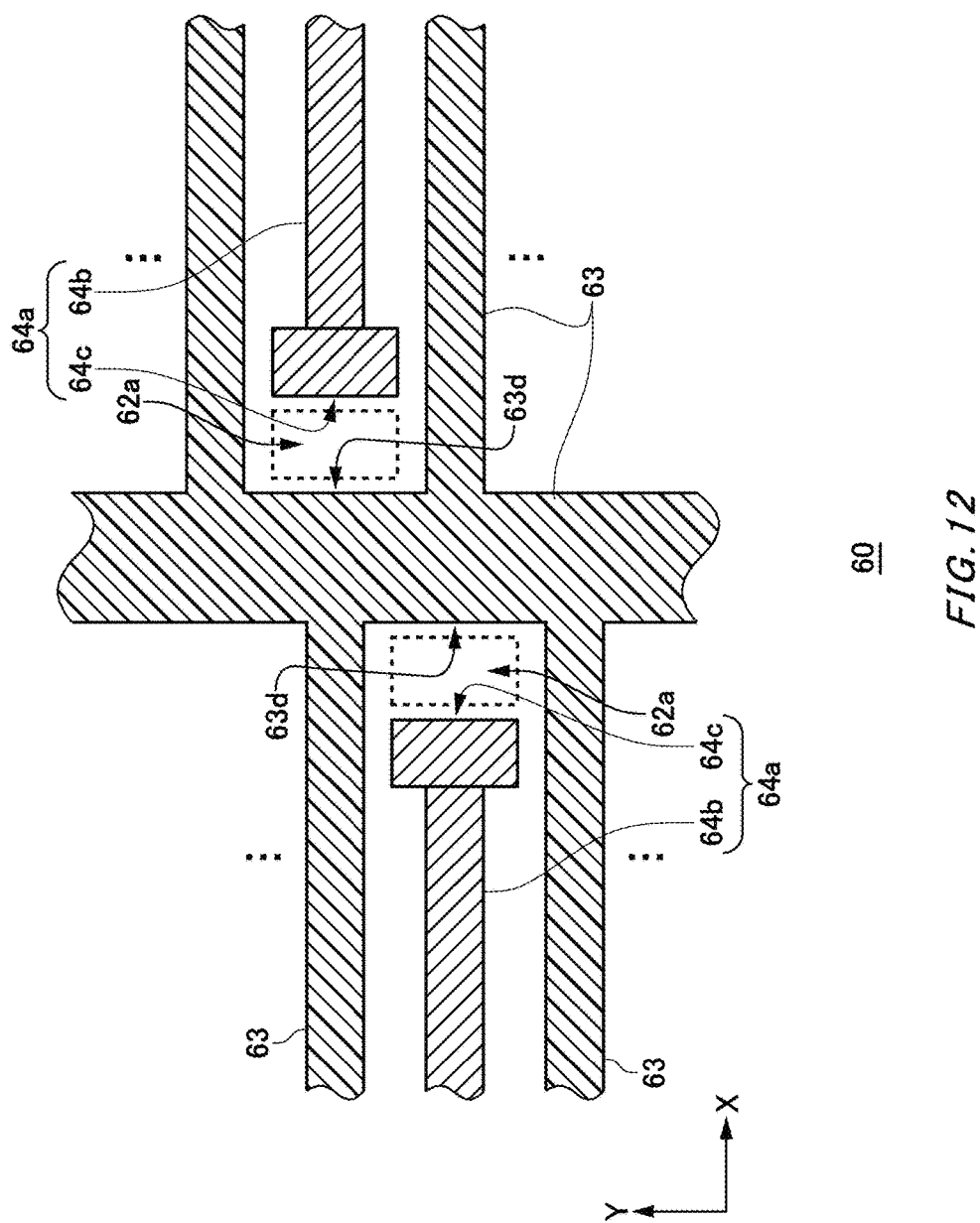
FIG. 12 is a planar view of an enlarged portion of FIG. 11A.
Figure 13:
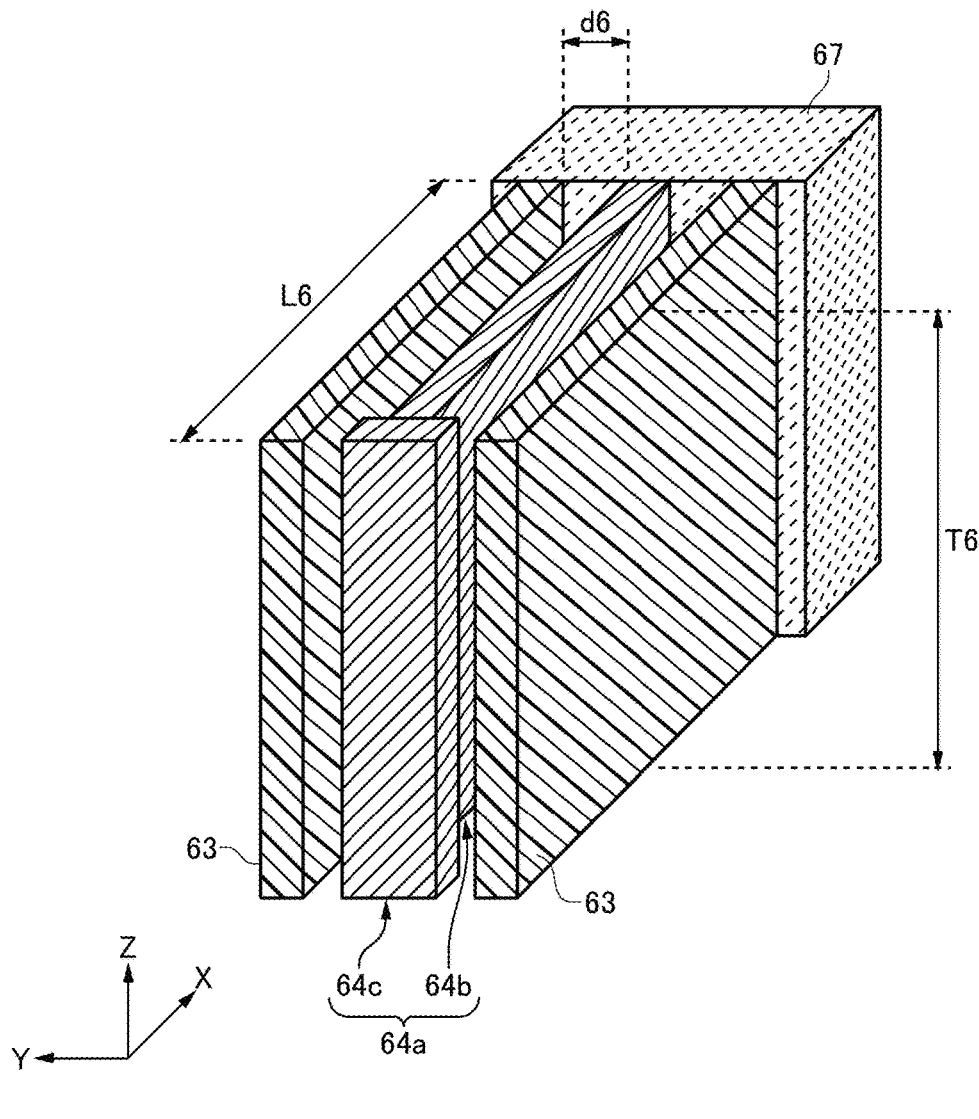

FIG. 12 is a planar view of an enlarged portion of FIG. 11A. FIG. 13 shows an exemplary perspective view of a portion of the deflection layer 60 according to the present embodiment, as seen from the beam passing space 62a. In other words, FIG. 13 is a perspective view showing a three-dimensional structure of a portion of the deflection layer 60. The structure of an electrode section is described using FIGS. 12 and 13.

The region shown in the dashed-line square of FIG. 12 is a beam passing space 62a in the deflection layer 60 through which passes an electron beam that has passed through a first aperture 52 of the aperture layer 50. Specifically, the deflection layer 60 includes a plurality of beam passing spaces 62a that correspond to the plurality of first apertures 52 of the aperture layer 50. The beam passing spaces 62a are arranged along the Y-axis direction in the drawing, and the electron beams that have passed through these beam passing spaces form the array beam oriented along the Y-axis direction.

As shown in FIG. 12, the first electrode sections 63 include a first electrode 63d facing a beam passing space 62a. The first electrode 63d may be a portion of the first electrode sections 63. Specifically, the first electrode sections 63 include a plurality of first electrodes 63d that correspond respectively to the plurality of beam passing spaces 62a. The first electrodes 63d may be connected to and formed integrally with the first electrode sections 63, and may electrically have the same potential, for example.

The second electrode sections 64a each include, in the deflection layer 60, an extending portion 64b that extends independently toward the beam passing space 62a and a second electrode 64c that faces the first electrode 63d in a manner to sandwich the beam passing space 62a between the first electrode 63d and an end portion of the second electrode 64c. Here, "independently" means that the electrode section is spatially distanced from other electrodes in the deflection layer 60 and from other adjacent layers, so as to be electrically insulated from these other electrodes and layers. The width of the second electrode 64c facing the beam passing space 62a may be formed to be greater than the width of the extending portion 64b in the extension direction.

FIG. 13 is a perspective view diagonal to the X-axis direction in which the first electrode sections 63 and the second electrode sections 64a extend, from a beam passing space 62a of the deflection layer 60. In the deflection layer 60, the first electrode sections 63 are independent from the adjacent layers and the second electrode sections 64a, and extend from the insulating section 67 to the first electrode 63d on the sides of the extending portions 64b of the second electrode sections 64a. In other words, the first electrode sections 63 and the second electrode sections 64a are independent from each other in the deflection layer 60, and respectively extend from the insulating section 67 to the beam passing spaces 62a along the side surfaces of the electrode extending portions. As described above, the average space width d6 between the first electrode sections 63 and the second electrode sections 64a may be approximately 500 nm. Furthermore, at the portions where the space between the electrodes is narrowest, the space width may be approximately 200 nm. The length L6 of the extending portions 64b of the electrodes may be greater than or equal to 50 μm.

FIG. 13 shows an inter-electrode space sandwiched between a beam passing space 62a and the insulating section 67 with an aspect ratio greater than or equal 100, e.g. a case where the space width d6 is 500 nm and the length L6 is greater than or equal to 50 μm. In a case where such an inter-electrode space is sandwiched and the insulating section 67 is present, even if an electron beam is scattered because of the first aperture 52 of the aperture layer 50, the first electrode 63d facing the beam passing space 62a, the electrode surface of the second electrode 64c, or the like, it is possible to decrease the occurrence of the scattered beam reaching the surface of the insulating section 67 recessed in the inter-electrode space. In other words, the deflection layer 60 according to the present embodiment can prevent charging of the insulating section 67. With such a device 10 that deforms and deflects the charged particle beam, unstable device operation is known to be caused by the deposition of contaminants due to charging of the insulating material, electrostatic breakdown, and the like. By using the structure described above for the deflection layer 60, it is possible to prevent charging of the insulating section 67 and increase the operational stability of the device 10.

Figure 14:
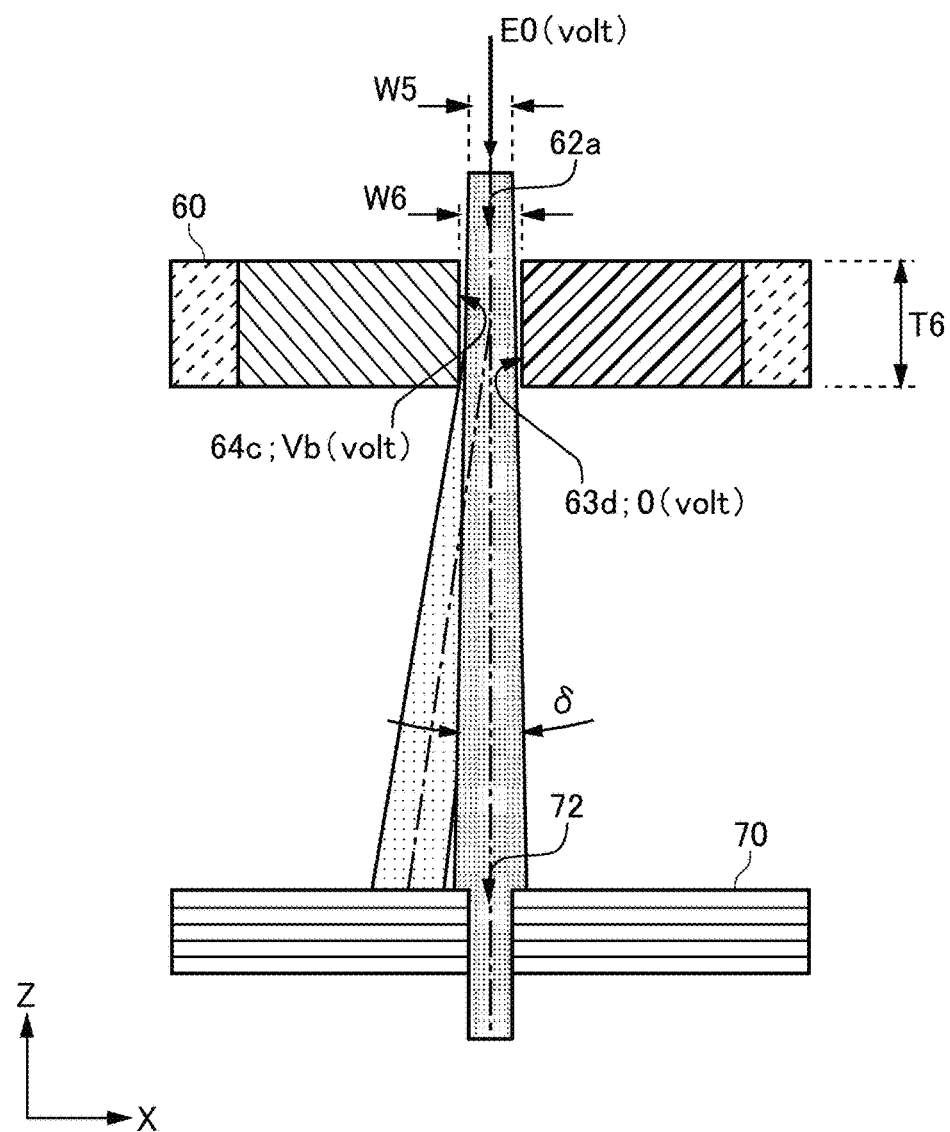
FIG. 14 shows an exemplary cross section of the deflection layer 60 and the stopping plate 70 according to the present invention.

FIG. 14 shows an exemplary cross section of the deflection layer 60 and the stopping plate 70 according to the present invention. Specifically, FIG. 14 shows an exemplary trajectory path of an electron beam that has passed through the deflection layer 60 of the device 10. The electron beam is incident to the deflection layer 60 while having a width substantially equal to the width W5 of the first aperture 52 of the aperture layer 50. The width W6 represents the space between a first electrode 63d and a second electrode 64c, which face each other across a beam passing space 62a of the deflection layer 60. The thickness T6 represents the length of the electrode in the beam passing direction. The angle δ represents the flare angle of the electron beam that has passed through the deflection layer 60.

When voltage is not applied between the first electrode 63*d* and the second electrode 64*c*, the electron beam passes through the aperture 72 of the stopping plate 70 and reaches the sample 116 (beam ON state). On the other hand, when voltage is applied between the first electrode 63*d* and the second electrode 64*c*, the electron beam is deflected by the electrical field between the electrodes. In order to realize the beam OFF state, the electron beam that has already passed through the deflection layer 60 must at least have a deflection angle, i.e. an inclined angle of the beam progression direction caused by the deflection, greater than the flare angle δ of the beam. In the beam OFF state, the voltage applied between the first electrode 63*d* and the second electrode 64*c* is Vb and the acceleration voltage of the electrons incident to the device 10 is E0. In a case where the deflection electrodes are approximated by sufficiently wide parallel plate electrodes, the conditions under which the electron beam passing therethrough realizes the beam OFF state are expressed as shown by the expression below.

Expression 3: $(1/2) \cdot (T6/W6) \cdot (Vb/E0) > \delta$

Using Expression 3, the necessary thickness T6 of the electrode is calculated. As an example, the acceleration voltage E0 of the electron beam is set to 50 keV, the deflection voltage Vb applied between the first electrode 63*d* and the second electrode 64*b* is set to 5 V, and the inter-electrode space W6 between the first electrode 63*d* and the second electrode 64*b* is set to 900 nm. Since this occurs before the contraction effect caused by the electron lens system, the flare angle δ is set such that δ≤1 mrad. In this case, the electrode length T6 in the beam progression direction is calculated such that T6>8 μm. Expression 3 is calculated by approximating the deflection electrodes with sufficiently wide parallel plate electrodes, and therefore the accuracy of this approximation decreases at the ends of the electrodes.

Figure 15A:
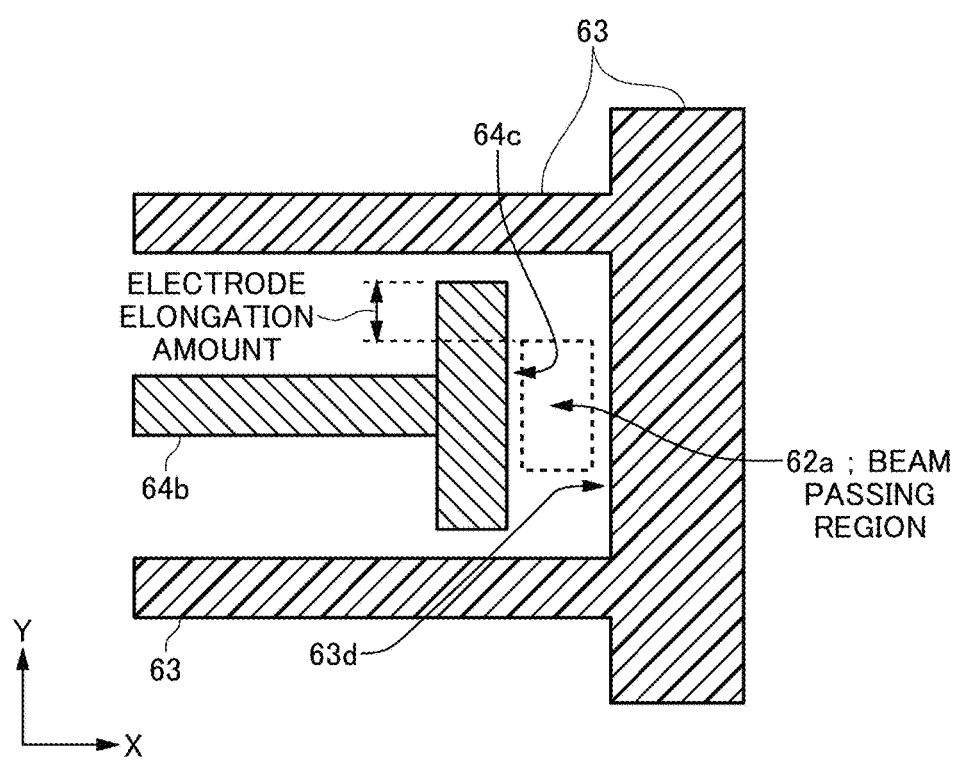
FIG. 15A shows a first example of a second electrode 64c according to the present embodiment.

FIG. 15A shows a first example of a second electrode 64*c* according to the present embodiment. FIG. 15A shows an enlarged view of the electrode structure near a beam passing space 62*a* of the deflection layer 60. The second electrode 64*c* facing the beam passing space 62*a* is formed in a manner to be surrounded by the first electrode section 63. When the deflection voltage is applied to the second electrode 64*c*, the electrical field generated from the central portion of the second electrode 64*c* in the Y-axis direction is oriented in the direction of the opposing first electrode 63*d* and the electrical fields generated from the end portions of the second electrode 64*c* in the Y-axis directions are respectively oriented in the directions of the first electrodes 63 adjacent above and below to the ends of the second electrode 64*c*, i.e. the first electrodes 63 on the +Y side and the −Y side. Therefore, in a case where the width of the second electrode 64*c* in the Y-axis direction is approximately the same as the width of the beam passing space 62*a* in the Y-axis direction, the deflection electrical fields for the electron beams passing through the end portions of the beam passing space 62*a* on the +Y side and the −Y side include a relatively large amount of electrical field components in a direction substantially parallel to the up-down direction in the drawing, i.e. the Y-axis direction. Therefore, the amount of electrical field components in a direction substantially parallel to the X-axis direction in the beam passing space 62*a* is reduced, and this causes the deflection angle in the X-axis direction to become relatively small.

FIG. 15A shows an example in which, in order to reduce this effect, the width of the second electrode 64*c* in the Y-axis direction is increased by an electrode elongation amount beyond the width of the beam passing space 62*a* in the Y-axis direction. In other words, the width of the second electrode 64*c* facing the beam passing space 62*a*, i.e. the width of the second electrode 64*c* in the Y-axis direction, is formed to be greater than the width of the beam passing space 62*a* in the Y-axis direction. In this way, the end portions of the beam passing space 62*a* on the +Y side and the −Y side are distanced from the end portions of the second electrode 64*c* in the Y-axis direction, and the deflection electrical field for the electron beam passing through the beam passing space 62*a* can be an electrical field emitted from near the center of the second electrode 64*c* with relatively little effect from the electrode end portions. In other words, it is possible to reduce the generation of electrical field components substantially parallel to the Y-axis direction in the deflection electrical field in the beam passing space 62*a*.

Figure 15B:
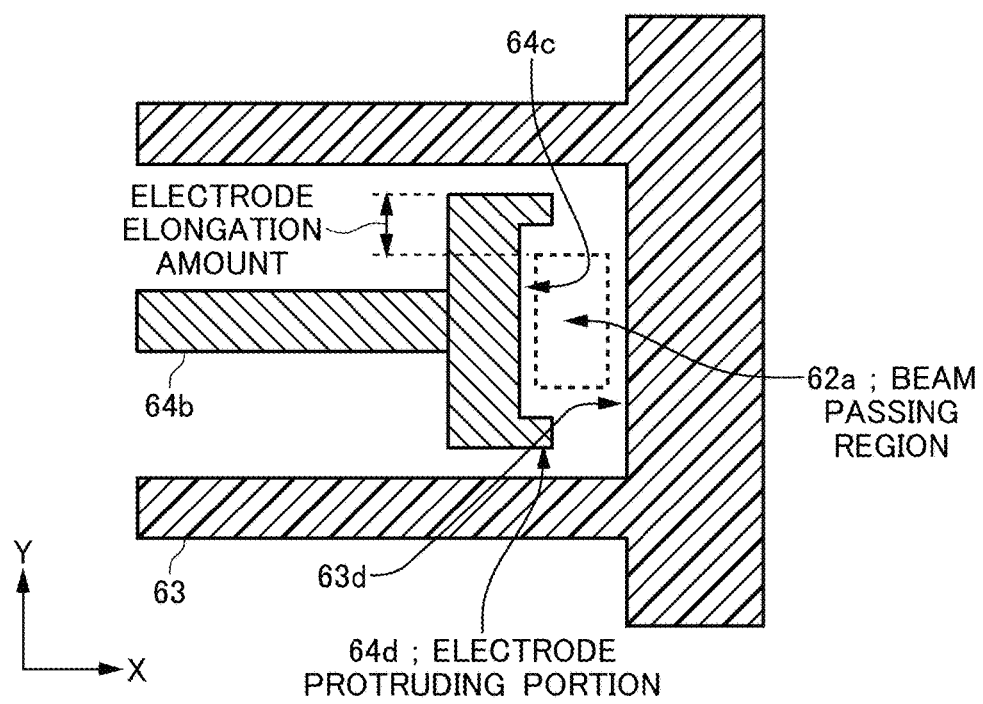
FIG. 15B shows a second example of a second electrode 64c according to the present embodiment.

FIG. 15B shows a second example of a second electrode 64*c* according to the present embodiment. FIG. 15B shows an example in which, an electrode protruding portion 64*d* protruding toward the beam passing space 62*a* is provided at each end portion of the second electrode 64*c*, in order to decrease the effect of the end portions of the second electrode 64*c* on the deflection electrical field in the beam passing space 62*a*. In other words, an electrode protruding portion 64*d* protruding toward the beam passing space 62*a* is included at each end portion of the surface of the second electrode 64*c* facing the beam passing space 62*a*. In this way, the end portions of the second electrode 64*c* draw near the first electrode 63*d* due to the electrode protruding portions 64*d* and the electrical fields generated from these end portions are oriented toward the first electrode 63*d*, and therefore the second electrode 64*c* of the second example is also able to reduce the generation of electrical field components substantially parallel to the Y-axis direction in the deflection electrical field in the beam passing space 62*a*. As described above, the structures of the second electrode 64*c* described in FIGS. 15A and 15B are capable of efficiently generating the deflection electrical field for the electron beam passing through the beam passing space 62*a* in a manner to provide a predetermined deflection angle.

Figure 15C:
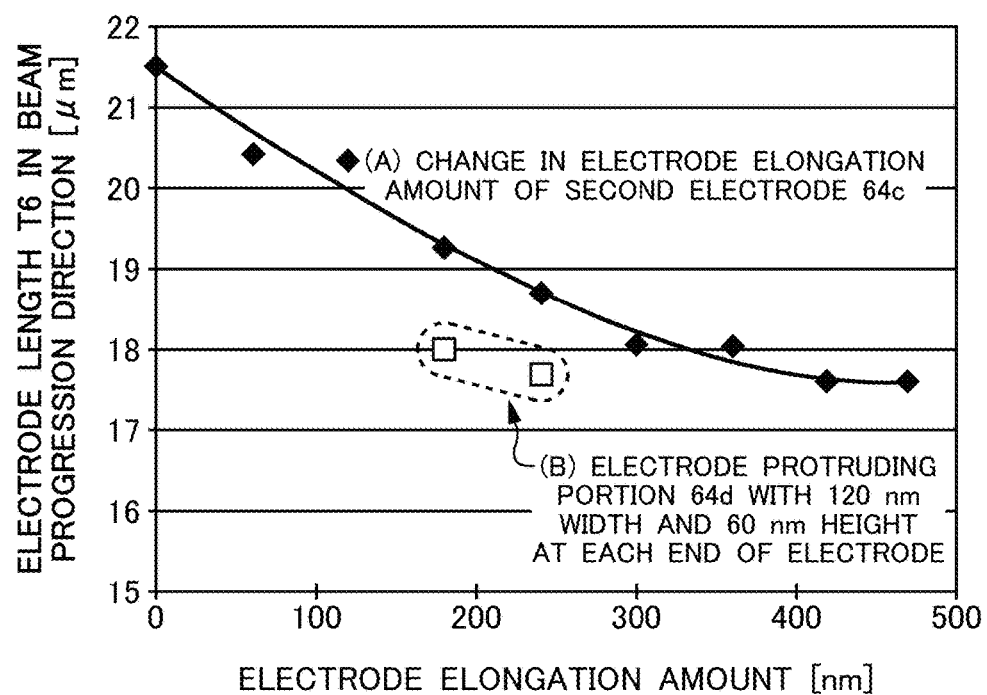
FIG. 15C shows an exemplary relationship between the electrode elongation amount and the electrode length T6 in the beam progression direction, according to the present embodiment.

FIG. 15C shows an exemplary relationship between the electrode elongation amount and the electrode length T6 in the beam progression direction, according to the present embodiment. FIG. 15C was realized by manufacturing actual electrodes and obtaining the relationship between the electrode elongation amount shown in FIG. 15A and the electrode length T6 in the beam progression direction needed to realize the beam OFF state for substantially identical applied voltages. FIG. 15C shows an example in which the acceleration voltage E0 of the electron beam is 50 keV, the deflection voltage Vd applied between the first electrode 63*d* and the second electrode 64*c* is 5 V, and the inter-electrode space W6 between the first electrode 63*d* and the second electrode 64*c* is 900 nm.

FIG. 15C shows that the beam OFF state can be realized with a shorter electrode length T6 when the electrode elongation amount of the second electrode 64*c* is greater. For example, it is understood that in order to realize an electrode length T6 from 18 μm to the electrode elongation amount of the second electrode 64*c* is preferably from 200 nm to 300 nm. Furthermore, FIG. 15C shows an effect of reducing the electrode length T6 in a case where electrode protruding portions 64*d* having a width of 120 nm and a height of 60 nm are provided at the end portions of the second electrode 64c. It is understood that by providing the electrode protruding portions 64d, the electrode length T6 can be shortened to approximately 1 µm to 1.5 µm.

Figure 16:
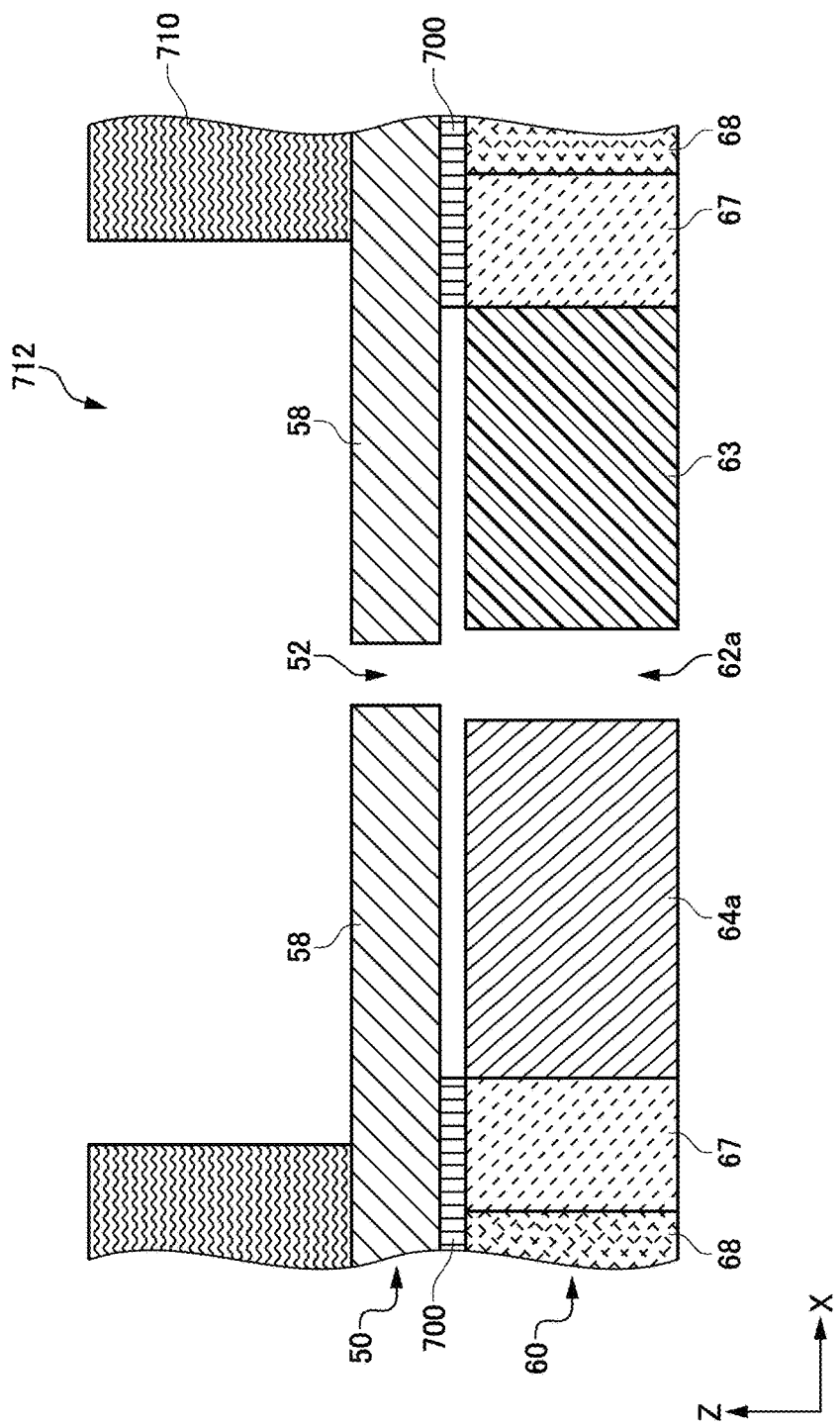
FIG. 16 shows a first modification of the device 10 according to the present embodiment.

FIG. 16 shows a first modification of the device 10 according to the present embodiment. FIG. 16 is an exemplary cross-sectional view of the device 10. The device 10 of the first modification further includes an insulating layer 700 and a base layer 710. The insulating layer is provided between the aperture layer 50 and the deflection layer 60. The insulating layer 700 includes an aperture in the XY plane formed by removing a region of the insulating layer 700 having a wider range than the first aperture 52, at a portion of the insulating layer 700 corresponding to the position where the first aperture 52 of the aperture layer 50 is formed. Furthermore, the first electrodes 63 and the second electrodes 64a in the deflection layer 60 are distanced from each other, and the insulating layer 700 provides electrical insulation between these electrodes. The insulating layer 700 may include a silicon oxide film.

The thickness of the insulating layer 700 is from 200 nm to 500 nm. The aperture of the insulating layer 700 may be formed in the XY plane as a circle that has a radius exceeding 50 µm and a center located within a range corresponding to the position where the first aperture 52 of the aperture layer 50 is formed. The insulating layer 700 may be formed in contact with the insulating section 67 of the deflection layer 60. In this way, by forming the insulating layer 700 at a position at least substantially 50 µm away from the beam passing space 62a, it is possible to decrease the occurrence of scattered electrons reaching the surface portion of the insulating layer 700. In other words, the device 10 according to the present embodiment can prevent charging of the insulating layer 700 and improve operational stability while securing the aperture layer 50 and the deflection layer 60 using the insulating layer 700.

In the device 10 of the first modification, the aperture layer 50 and the deflection layer 60 are formed integrally with the insulating layer 700 in a manner to sandwich the insulating layer 700. In the device 10 where the aperture layer 50, the deflection layer 60, and the insulating layer 700 are formed integrally, the positional relationship between the first aperture 52 of the aperture layer 50 and the beam passing space 62a of the deflection layer 60 can be realized through pre-alignment. The column section 120 including such a device 10 need not contain an alignment section 82 (see FIG. 1) for aligning the electron beam passed through the first aperture 52 with the beam passing space 62a of the deflection layer 60, and therefore the exposure apparatus 100 can be simplified.

The base layer 710 is provided closer to the first surface than the aperture layer 50. The base layer 710 includes a base layer aperture 712 for exposing the first aperture 52 portion of the aperture layer 50 on the first surface side facing the electron gun 20 of the device 10. By holding the aperture layer 50, the deflection layer 60, and the insulating layer 700 that are formed integrally, the base layer 710 improves the mechanical strength of the overall device 10. Furthermore, the base layer 710 can contribute to the exhaust heat of the aperture layer 50 that is heated by the electron beam irradiation.

Figure 17:
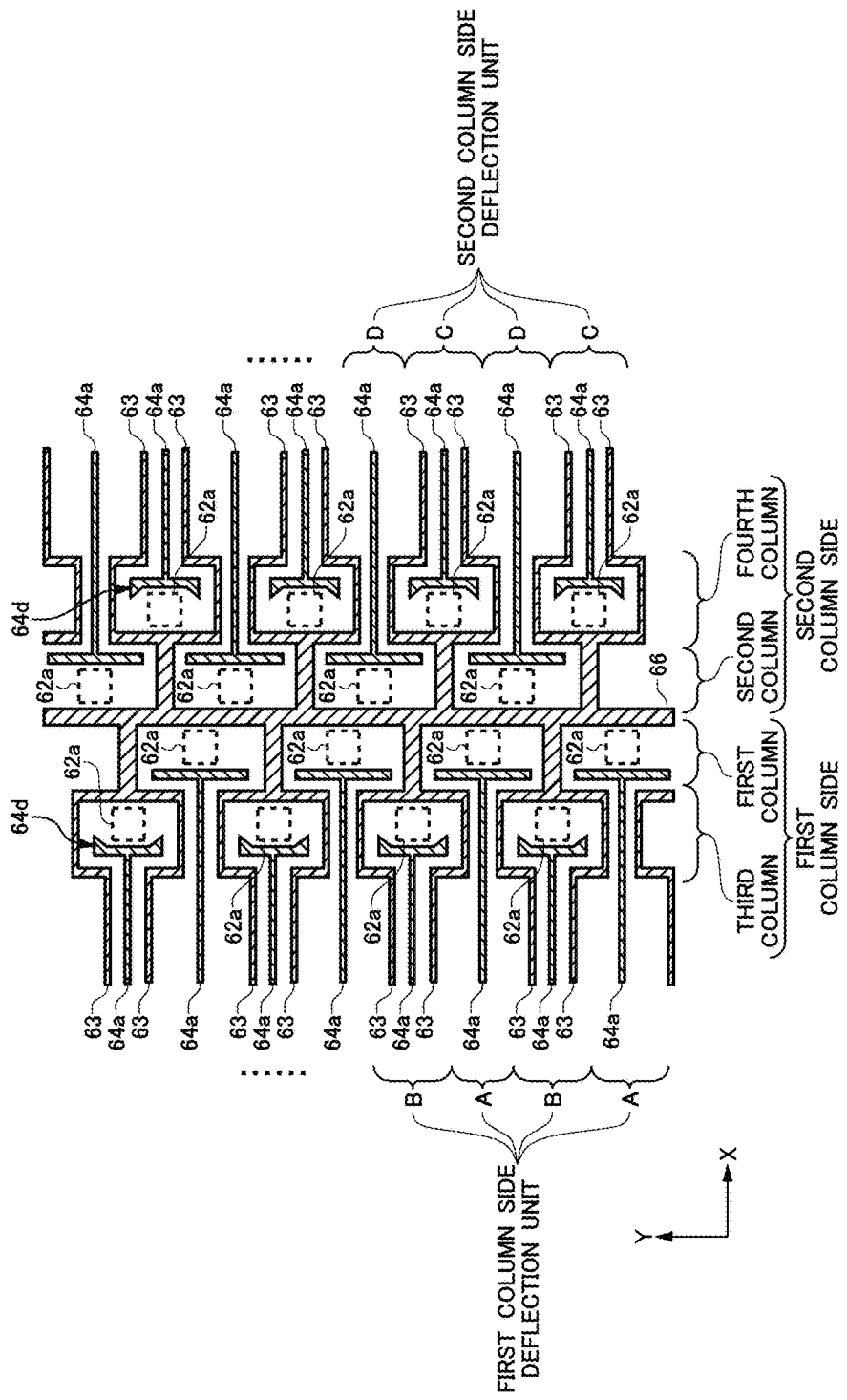
FIG. 17 shows a second modification of the device 10 according to the present embodiment.

FIG. 17 shows a second modification of the device 10 according to the present embodiment. FIG. 17 is an example of a planar view of the deflection layer 60 of the device 10 as seen from the side from which the beam is incident. FIGS. 10A and 11A describe an example in which two columns arranged in the Y-axis direction that each contain a first aperture 52 of the aperture layer 50 and a beam passing space 62a of the deflection layer 60 in the device 10 sandwich the first electrode section 63 extending in the X-axis direction. In the device 10 of the second modification, a plurality of columns each containing a first aperture 52 and a beam passing space 62a are arranged in the Y axis direction. The device 10 of the second modification shown in FIG. 17 is an example in which a total of four columns of beam passing spaces 62a are provided, from a first column to a fourth column. In accordance with this, a plurality of deflection units are arranged on each of a first column side and a second column side that are parallel to each other, and the deflection units include first apertures 52 of the aperture layer 50, beam passing spaces 62a of the deflection layer corresponding to the first apertures 52, first electrode sections 63, and second electrode sections 64a. As shown in FIG. 17, the extension direction of the extending portions 64b in the second electrode sections 64a of the deflection units arranged along the first column is opposite the extension direction of the extending portions 64b in the second electrode sections 64a of the deflection units arranged along the second column.

In FIG. 17, a deflection unit formed to correspond to a beam passing space 62a in the first column is referred to as a deflection unit A and a deflection unit formed to correspond to a beam passing space 62a in the third column is set as a deflection unit B. In other words, the deflection units on the first column side are arranged in an alternating manner of A, B, A, B, etc. along the Y-axis direction. Furthermore, a deflection unit formed to correspond to a beam passing space 62a in the second column is referred to as a deflection unit D and a deflection unit formed to correspond to a beam passing space 62a in the fourth column is set as a deflection unit C. In other words, the deflection units on the second column side are arranged in an alternating manner of C, D, C, D, etc. along the Y-axis direction.

The exposure apparatus 100 scans the array beam formed by passing through the first apertures 52 and the beam passing spaces 62a arranged in the Y-axis direction in this manner along the longitudinal direction, i.e. the X-axis direction, of the line pattern provided in advance on the sample 116. The scanning positions of the beams formed by the deflection units in the order of A, C, B, D, A, C, B, D, etc. are lined up without breaks at substantially the same pitch in the Y-axis direction, and therefore the Y-axis direction scanning position of each beam can be scanned in alignment with the grid lines (see FIG. 4). In this way, the array beam formed by the device 10 of the second modification can expose the cut pattern and via pattern designed based on the grid lines arranged at constant intervals in the Y-axis directions.

In the device 10 of the second modification, a plurality of the deflection units are arranged along a plurality of first columns and a plurality of second columns, and therefore the degree of design freedom of the deflection units generating the deflection electrical field in the beam passing spaces 62a can be improved. For example, in the device 10 of the second embodiment, the width of a second electrode 64c corresponding to a beam passing space 62a can be formed to be greater than or equal to the width of the this beam passing space 62a, or an electrode protruding portion 64d can be further provided.

Figure 18:
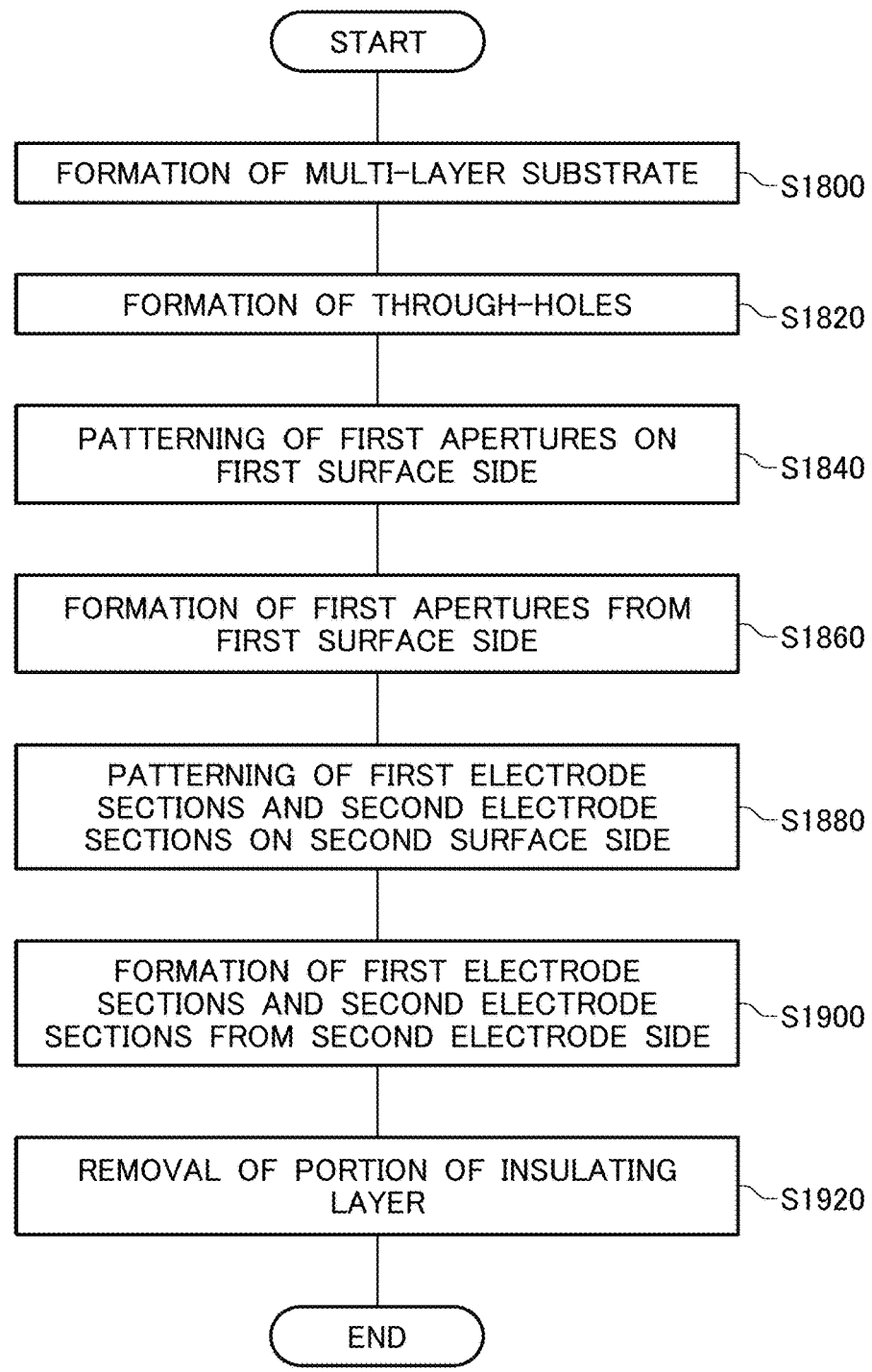
FIG. 18 shows a manufacturing flow of the device 10 of the first modification shown in FIG. 16.

FIG. 18 shows a manufacturing flow of the device 10 of the first modification shown in FIG. 16. The present embodiment is an example in which the device 10 is manufactured by performing the manufacturing process from S1800 to S1920. The devices 10 having the other configurations described above can also be manufactured by performing a flow similar to the manufacturing flow shown in FIG. 18.

First, a multi-layer substrate is formed by layering the aperture layer substrate 58, the insulating layer 700 and the deflection layer substrate 68 in the stated order on a substrate that will become the base layer 710 (S1800). Next, a portion of the substrate that will become the base layer 710 is removed, and a region in which the apertures of the aperture layer substrate 58 and the like are to be formed is exposed. Specifically, in the multi-layer substrate at the present stage, a portion of the aperture layer substrate 58 is exposed on the first surface on the base layer 710 side, and the deflection layer substrate 68 is positioned on a second surface that is on the opposite side of the first surface. The substrate material of the base layer 710 is silicon, for example. The material of the aperture layer substrate 58 and the deflection layer substrate 68 is silicon provided with conductivity by doping with impurities, for example. The material of the insulating layer 700 is silicon oxide, for example.

Next, in a state where the first apertures 52, the first electrode sections 63, and the second electrode sections 64a of the device 10 have not yet been formed, through-holes 950 are formed that penetrate from the aperture layer substrate 58 exposed on the first surface side to the deflection layer substrate 68 (S1820). These through-holes 950 are used as mark structures for alignment in this manufacturing process.

Next, the pattern forming the first apertures 52 is patterned on the surface of the aperture layer substrate 58 exposed on the first surface side (S1840). The first apertures 52 are then formed by etching the aperture layer substrate 58 from the first surface side of the device 10, based on the patterned shape (S1860). The etching used here is preferably anisotropic etching. In this way, the aperture layer 50 including the first apertures 52 that deform and pass the beams incident thereto from the first surface side of the device 10 is formed. The step of forming the aperture layer 50, including the patterning and the etching, preferably includes determining the positions of the first apertures 52 using the centers of the through-holes 950 on the first surface side, for example, as a reference.

Next, the pattern of the first electrode sections 63 and the second electrode sections 64a is patterned on the surface of the deflection layer substrate 68 on the second surface side (S1880). The first electrode sections 63 and the second electrode sections 64a are then formed by etching the deflection layer substrate 68 from the second surface side of the device 10 based on the patterned shape (S1900). The etching used here is preferably anisotropic etching. In this way, the deflection layer 60 for passing and deflecting the beams passed by the aperture layer 50 is formed. The step of forming the deflection layer 60, including the patterning and the etching, preferably includes determining the positions of the first electrode sections 63 and the second electrode sections 64a using the centers of the through-holes 950, for example, as a reference.

A portion of the insulating layer 700 between the aperture layer substrate 58 and the deflection layer 60 is removed by isotropic etching (S1920). Specifically, after formation of the first electrode sections 63 and the second electrode sections 64a, a portion of the insulating layer 700 that contacts at least the first electrodes 63d of the first electrode sections 63 and the second electrodes 64c and extending portions 64b of the second electrode sections 64a is removed through etching. The width of the short side portion of each of the electrodes 63 and 64a contacting the insulating layer 700 is preferably formed to be approximately equal to the thickness of the insulating layer 700. By using isotropic etching such as wet etching, the etching fluid reaches the insulating layer 700 side sandwiched between the aperture layer substrate 58 and the electrodes 63 and 64a, and it is possible for the removal of the insulating layer 700 to progress together both in the depth direction of the insulating layer 700, i.e. the Z-axis direction, and the width direction on the back side of the short side portions of the electrodes 63 and 64a, i.e. the X-axis direction and Y-axis direction. In this way, the electrodes 63 and 64a remain and it is possible to remove the insulating layer 700 on the back sides thereof, i.e. on the first surface side. In this way, the insulating layer 700 is formed between the aperture layer substrate 58 and the deflection layer 60. By removing a portion of the insulating layer 700, the first electrode sections 63 and the second electrode sections 64a in the deflection layer 60 are distanced from the aperture layer substrate 58 to form independent electrode structures.

Figure 19:
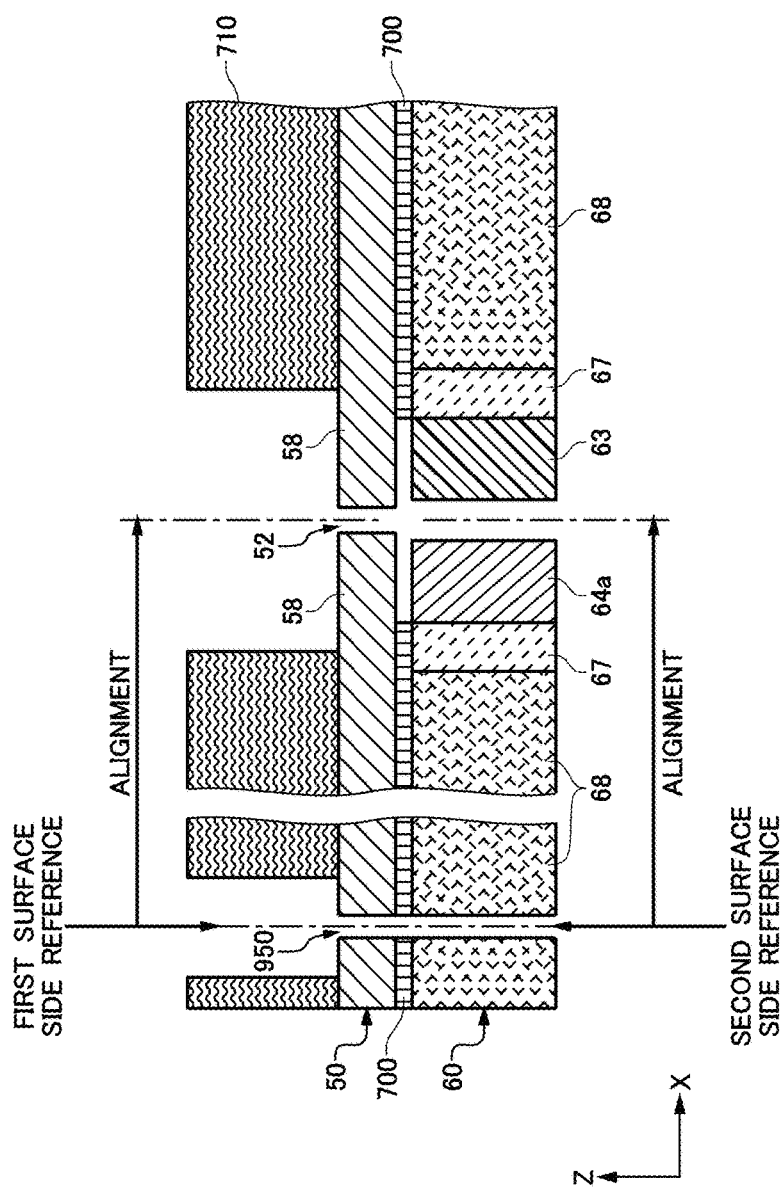
FIG. 19 shows an exemplary cross-sectional view of a device 10 formed using the manufacturing flow shown in FIG. 18.

FIG. 19 shows an exemplary cross-sectional view of a device 10 formed using the manufacturing flow shown in FIG. 18. The through-holes 950 are preferably used as common references when machining from the first surface side and when machining from the second surface side. In this way, the machining accuracy on the first surface side and the second surface side of the device 10 can be easily improved.

In the step of forming the aperture layer 50 and the deflection layer 60, an electron beam exposure apparatus may be used as the patterning apparatus. The electron beam exposure apparatus may have a function to detect mark positions, and this function is used to detect the position and shape of the through-holes 950 exposed on the first surface side from the first surface side and use these through-holes as reference positions on the first surface side. The electron beam exposure apparatus performs alignment based on these reference positions and exposes the pattern of the first apertures 52 on the surface of the aperture layer substrate 58 on the first surface side.

In a similar manner, the electron beam exposure apparatus uses this mark position detection function to detect the position and shape of the through-holes 950 exposed on the second surface side from the second surface side and use these through-holes as reference positions on the second surface side. The electron beam exposure apparatus performs alignment based on these reference positions and exposes the pattern of the first electrodes 63 and the second electrodes 64a on the surface of the deflection layer substrate 68 on the second surface side. In this way, the first apertures 52 formed from the first surface side of the device 10 and the beam passing spaces 62a surrounded by the first electrode sections 63 and second electrode sections 64a formed from the second surface side are aligned using the same reference points, i.e. the through-holes 950, and therefore it is possible to accurately form the device 10.

Figure 20:
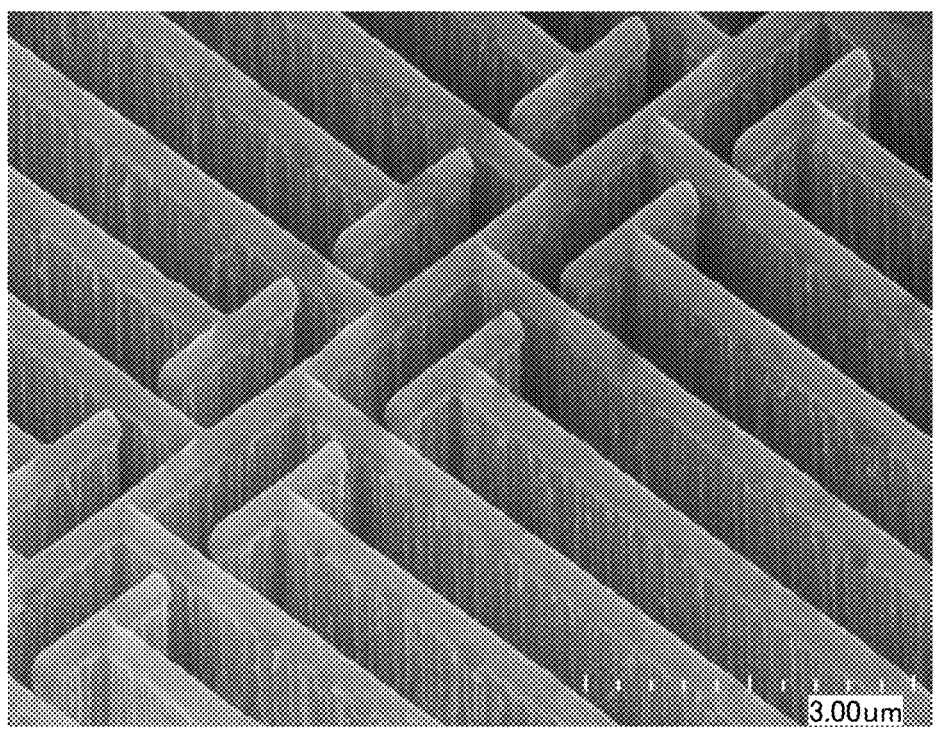
FIG. 20 shows an example of an electrode section of the deflection layer 60 that was actually formed.

In the step of forming the aperture layer 50 and the step of forming the deflection layer 60, reactive-ion etching (RIE) is used as the anisotropic etching, for example. FIG. 20 shows an example of an electrode section of the deflection layer 60 that was actually formed. FIG. 20 shows an example of a result obtained by manufacturing deflection electrodes (first electrodes 63 and second electrodes 64a) through anisotropic etching of the deflection layer substrate 68. In the manufactured example of the deflection electrode section shown in FIG. 20, the inter-electrode space width removed by deep etching is from 200 nm to 500 nm. Furthermore, the thickness in the beam passing direction of the electrode structure formed by etching is approximately 18 µm. The aspect ratio of the structure of the etched space portion is from 40 to 90.

Figure 21:
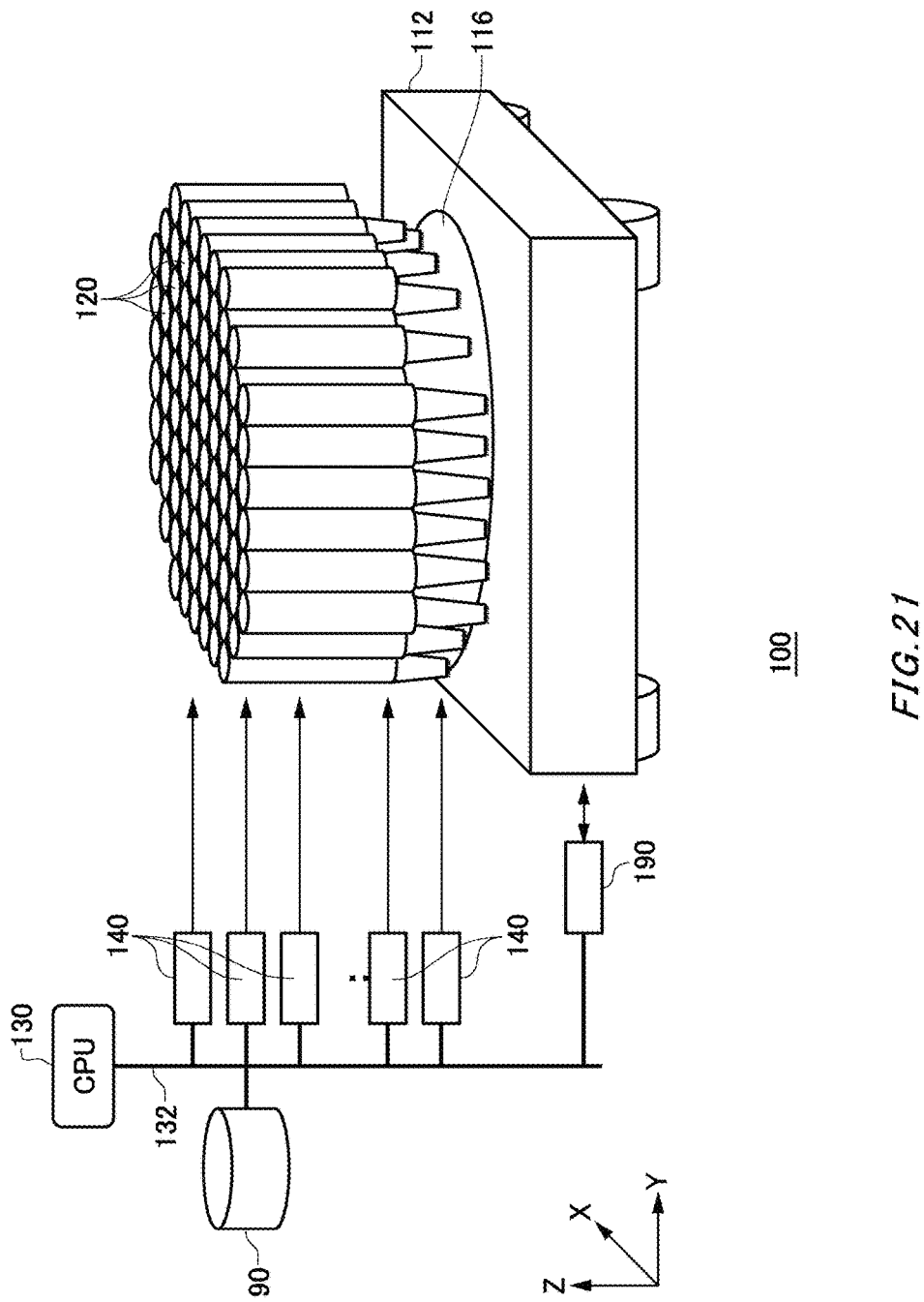
FIG. 21 shows a modification of the exposure apparatus 100 according to the present embodiment.

FIG. 21 shows a modification of the exposure apparatus 100 according to the present embodiment. In FIG. 21, components having substantially the same function as components of the exposure apparatus 100 according to the embodiment shown in FIG. 1 are given the same reference numerals, and redundant descriptions are omitted. The exposure apparatus 100 of the present modification includes a plurality of column sections 120 and a plurality of exposure control sections 140 that each include a selecting section 160, an irradiation control section 170, and a deflection amount determining section 180.

In the exposure apparatus 100 according to the present modification, in a case where the stage apparatus 112 is moved to perform scanning with the irradiation position of the array beam, it is not necessary for each exposure control section 140 to include the scanning control section 190. FIG. 21 shows an example of the exposure apparatus 100 including one stage apparatus 112, a plurality of column sections 120, one CPU 130, a plurality of exposure control sections 140 that do not include the scanning control section 190, and one scanning control section 190.

Each column section 120 is connected to a corresponding exposure control section 140 and exposes the sample 116. The operation of each column section 120 includes exposing the possible irradiation region 200 in each frame, in the manner described in FIG. 3 and the like. The scanning control section 190 controls the stage apparatus 112 to move the sample 116 mounted thereon relative to the plurality of column sections 120, and irradiates the sample 116 with charged particle beams in parallel from the plurality of column sections 120.

In this way, the electron beam exposure apparatus 100 of the present modification can perform the exposure in parallel with a plurality of column sections 120, and can therefore significantly improve the throughput of the exposure. Furthermore, even when the sample 116 is semiconductor wafer or the like with a large radius greater than or equal to 300 mm, it is possible to prevent a significant decrease in the throughput by increasing the number of column sections 120 in accordance with the radius.

With the exposure apparatus 100 of the present modification, there are cases where the intensities of the plurality of array beams output by the plurality of column sections 120 differ. Therefore, before performing the exposure, the exposure apparatus 100 may measure in advance the intensities of the array beams output respectively from the column sections 120. Furthermore, the exposure apparatus 100 may correct the passed time for each exposure control section 140, such that there is no variation among the plurality of exposure results of the column sections 120. Yet further, the exposure apparatus 100 may position the array beam and line pattern of the chip being irradiated by the array beam for each column section 120, such that the column sections 120 respectively expose the cut patterns associated with different semiconductor chips on a single sample 116.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A device that deforms and deflects a beam, comprising:
an aperture layer that includes a plurality of first apertures that each deforms and passes a beam incident thereto from a first surface side of the device; and
a deflection layer that passes and deflects the beam that has been passed by the aperture layer, wherein
the deflection layer includes:
a first electrode section that includes a first electrode facing a plurality of beam passing spaces in the deflection layer, each beam passing space corresponding to one first aperture; and
a plurality of second electrode sections, each including an extending portion that extends toward one beam passing space and that is independent from an adjacent layer in the deflection layer and, each second electrode section further including a second electrode that faces the first electrode in a manner to sandwich the respective beam passing space between the first electrode and an end portion of the second electrode.

2. The device according to claim 1, wherein
the first electrode section is independent from the adjacent layer and the second electrode section in the deflection layer, and extends along a side of the extending portion of the second electrode section until reaching the first electrode.

3. The device according to claim 1, wherein
width of the second electrode facing the beam passing space is greater than width of the extending portion in an extension direction.

4. The device according to claim 1, wherein
the second electrode includes an electrode protruding portion that protrudes toward the beam passing space at an end portion of a surface of the second electrode facing the beam passing space.

5. The device according to claim 1, further comprising:
an insulating layer that is provided between the aperture layer and the deflection layer, wherein
the insulating layer includes an aperture obtained by removing a portion of the insulating layer in a range that is wider than the first aperture, in a portion corresponding to the first aperture of the aperture layer.

6. The device according to claim 5, wherein
the first electrode section and the second electrode section are distanced from each other, and are electrically isolated from each other by the insulating layer.

7. The device according to claim 5, wherein
the insulating layer includes a silicon oxide film.

8. The device according to claim 1, wherein
the first electrode section and the second electrode section include a silicon layer provided with conductivity.

9. The device according to claim 1, further comprising:
a base layer that is provided closer to the first surface side than the aperture layer in the device and includes an aperture for exposing the first aperture on the first surface side of the device.

10. The device according to claim 1, wherein
a plurality of deflection units, which include a plurality of the first apertures and a plurality of the first electrode sections and the second electrode sections corresponding to the first apertures, are arranged along each of a first column and a second column that are parallel to each other, and an extension direction of the extending portions in the plurality of second electrode sections of the plurality of deflection units arranged along the first column is opposite an extension direction of the extending portions in the plurality of second electrode sections of the plurality of deflection units arranged along the second column.

11. The device according to claim 10, wherein
a plurality of the deflection units are arranged in each of a plurality of the first columns and a plurality of the second columns.

12. An exposure apparatus comprising:
a beam generating section that generates a beam;
the device according to claim 1 that deforms and deflects the beam; and
a control section that controls the deflection of the beam by the device and switches whether the beam irradiates a sample.

13. A manufacturing method for manufacturing a device that deforms and deflects a beam, comprising:
forming an aperture layer that includes a plurality of first apertures that each deforms and passes a beam incident thereto from a first surface side of the device; and
forming a deflection layer that passes and deflects the beam that has been passed by the aperture layer, wherein
the forming the deflection layer includes:
forming a first electrode section that includes a first electrode facing a plurality of beam passing spaces in the deflection layer, each beam passing space corresponding to one first aperture; and
forming a plurality of second electrode sections, each including an extending portion that extends toward one beam passing space and is independent from an adjacent layer in the deflection layer and each second electrode section further including a second electrode that faces the first electrode and in a manner to sandwich the respective beam passing space between the first electrode and an end portion of the second electrode.

14. The manufacturing method according to claim 13, wherein
the forming the aperture layer includes forming the first aperture in the aperture layer by etching the aperture layer from the first surface side of the device, and
the forming the deflection layer includes forming the first electrode section and the second electrode section in the deflection layer by etching the deflection layer from a second surface side of the device.

15. The manufacturing method according to claim 13, further comprising:
forming a through-hole that penetrates from the aperture layer to the deflection layer of the device, in a state where the first aperture, the first electrode, and the second electrode have not yet been formed, wherein
the forming the aperture layer includes determining a position of the first aperture using the through-hole as a reference, and
the forming the deflection layer includes determining positions of the first electrode section and second electrode section using the through-hole as a reference.

16. The manufacturing method according to claim 13, wherein
the device includes an insulating layer between the aperture layer and the deflection layer,
the insulating layer includes an aperture that passes the beam, and
the manufacturing method comprises, after formation of the first electrode and the second electrode, removing through isotropic etching a portion of the insulating layer that contacts at least a portion of the first electrode of the first electrode section and the second electrode and the extending portion of the second electrode section.

17. The device according to claim 1, wherein
the first electrode section is independent from the adjacent layer and the second electrode section in the deflection layer, and includes an extending portion that extends along a side of the extending portion of the second electrode section until reaching the first electrode, and
an aspect ratio of a length of the extending portion of the second electrode to an space width between the extending portion of the first electrode section and the extending portion of the second electrode portion is greater than or equal to 100.

18. The device according to claim 13, wherein
forming the first electrode section includes forming the first electrode section such that the first electrode section is independent from the adjacent layer and the second electrode section in the deflection layer, and such that the first electrode section includes an extending portion that extends along a side of the extending portion of the second electrode section until reaching the first electrode, and
wherein
an aspect ratio of a length of the extending portion of the second electrode to an space width between the extending portion of the first electrode section and the extending portion of the second electrode portion is greater than or equal to 100.

* * * * *